(12) United States Patent
Darche et al.

(10) Patent No.: US 11,490,542 B1
(45) Date of Patent: Nov. 1, 2022

(54) PATCH PANEL ADAPTERS

(71) Applicant: Amazon Technologies, Inc., Seattle, WA (US)

(72) Inventors: Randall Darche, Seattle, WA (US); Zachary Jackson, Middletown, DE (US)

(73) Assignee: Amazon Technologies, Inc., Seattle, WA (US)

(*) Notice: Subject to any disclaimer, the term of this patent is extended or adjusted under 35 U.S.C. 154(b) by 264 days.

(21) Appl. No.: 16/827,014

(22) Filed: Mar. 23, 2020

(51) Int. Cl.
*H05K 7/16* (2006.01)
*G06F 1/16* (2006.01)
*H01R 31/06* (2006.01)
*H05K 7/14* (2006.01)

(52) U.S. Cl.
CPC .............. *H05K 7/16* (2013.01); *G06F 1/1683* (2013.01); *H01R 31/06* (2013.01); *H05K 7/1491* (2013.01)

(58) Field of Classification Search
CPC ........ H05K 7/16; H05K 7/1491; H01R 31/06; G06F 1/1683
See application file for complete search history.

(56) References Cited

U.S. PATENT DOCUMENTS

| | | | | |
|---|---|---|---|---|
| 5,806,687 | A * | 9/1998 | Ballesteros | H05K 7/16 211/26 |
| 6,065,612 | A * | 5/2000 | Rinderer | H05K 7/16 211/175 |
| 7,518,863 | B2 * | 4/2009 | Wayman | H05K 7/186 165/185 |
| 7,760,982 | B2 * | 7/2010 | Quan | G02B 6/4466 439/577 |
| 7,795,532 | B2 * | 9/2010 | Walker | H05K 7/186 312/265.2 |
| 2016/0255421 | A1 * | 9/2016 | Farrar | E05B 47/00 340/870.07 |
| 2017/0096264 | A1 * | 4/2017 | Anderson | B65D 43/163 |

* cited by examiner

*Primary Examiner* — Matthew W Ing
(74) *Attorney, Agent, or Firm* — Athorus, PLLC

(57) ABSTRACT

Adapters for mounting patch panels to data center racks enable the patch panels to be repositioned with respect to the racks in a rotatable or pivotable manner. A patch panel mounted to an adapter has a jack or port on one side of the adapter, and a jack or port on another side of the adapter. With the adapter aligned at an obtuse angle with respect to a front edge of a rack, a component may be inserted into the rack, or removed from the rack. Subsequently, the adapter aligned at an acute angle, or any other angle, with respect to the front edge of the rack. Mounting patch panels to the adapters enables the patch panels to be maintained outside of the rack, and increases a number of components that may be installed within the rack, or space or volume that may e occupied by components within the rack.

20 Claims, 18 Drawing Sheets

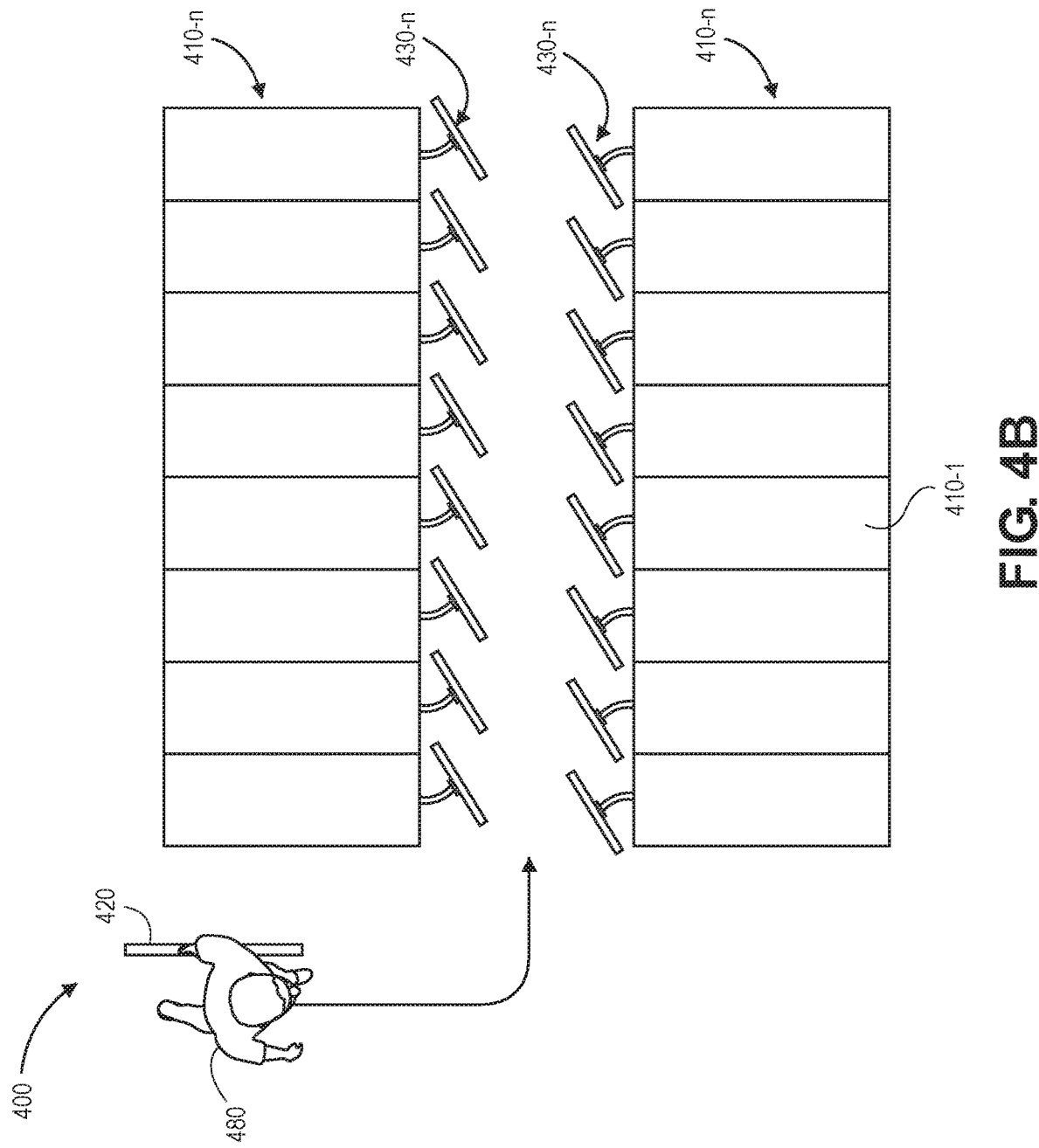

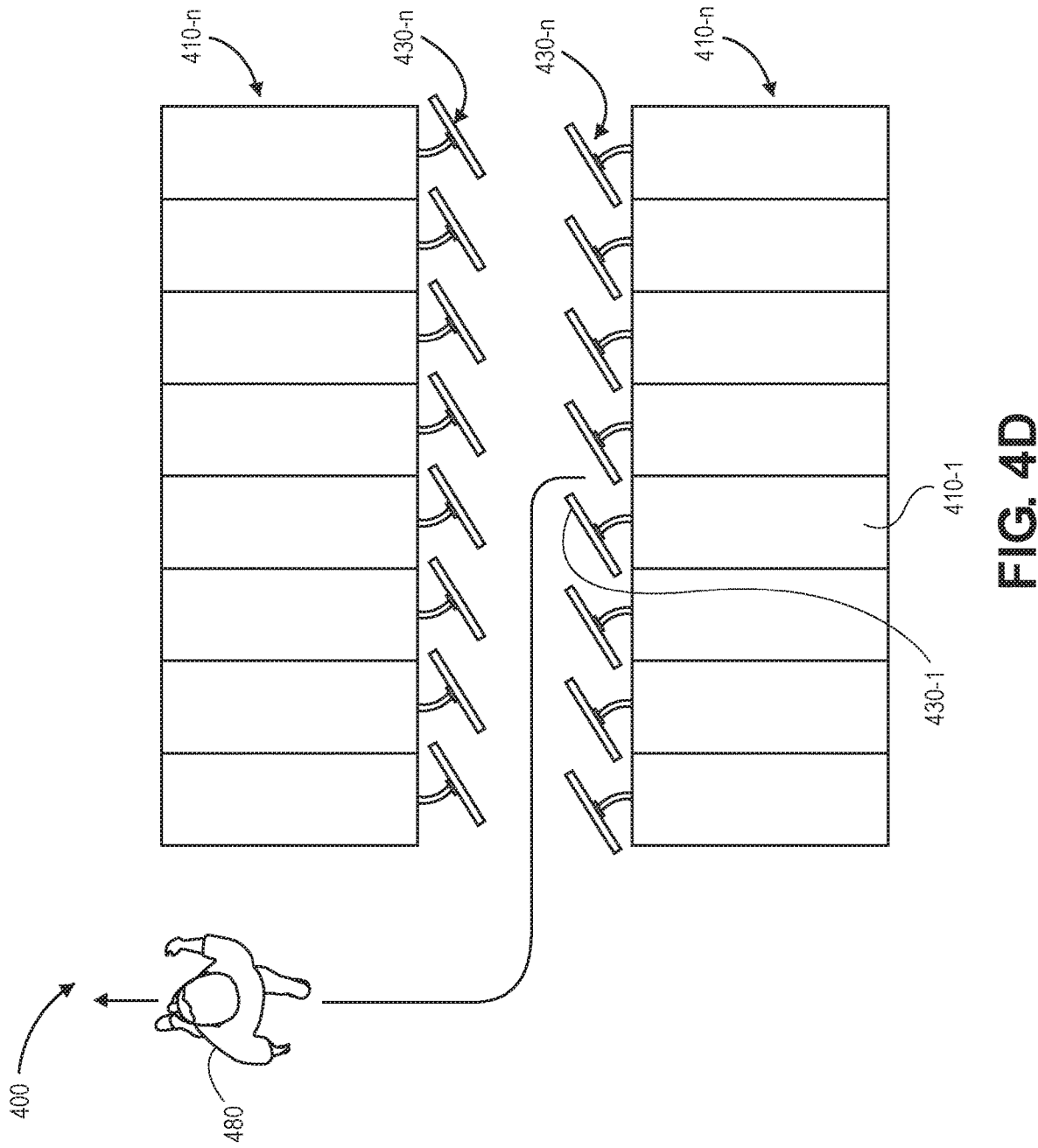

US 11,490,542 B1

PATCH PANEL ADAPTERS

BACKGROUND

Data center racks are rigid systems for accommodating computer, network or communication components such as power supplies, servers, switches, fans, cooling systems or other electronic components. A data center rack typically includes sets of one or more rails, tracks or other systems for supporting components within or in association with a frame that maintains the rails, tracks or other systems in a desired alignment. Additionally, a frame of a rack may be constructed to ensure that components may be readily inserted into the frame and removed therefrom in a substantially simple manner. Racks are commonly constructed with standard dimensions (e.g., lengths, widths and depths), and from materials such as aluminum, steel or composites. Additionally, racks may have open frames, e.g., frames that have rails but lack doors or other panels, or frames that are partially or entirely enclosed, e.g., frames in the form of cabinets or other systems that include doors or panels. Additionally, racks may be placed on floors or other surfaces, or mounted to walls or other systems. Moreover, racks may be arranged in groups, such as in parallel, and aligned to form columns or pathways through which workers may travel or airflow may pass.

A patch panel (or a patch field, or a patch bay) is a system component having a number of jacks or ports for connecting or routing computer, network or communication components to one another. Where a patch panel is provided in association with a rack, e.g., by hard-mounting the patch panel into the rack, components mounted or installed in the rack may be connected to the patch panel, and the patch panel may be connected to one or more external systems for providing power, connectivity or other services to the components.

A patch panel typically includes pairs of jacks or ports aligned along lines or arranged in arrays or patterns, with each of the pairs of jacks or ports acting as an intermediary between a component within a rack and another component located elsewhere in a facility within which the rack is provided. Patch panels typically connect such components to networks (e.g., local area networks, wide area networks or the Internet), to sources of alternating current or direct current power, or to any other system. Patch panels further enhance the scalability of data centers, and enable such data centers to add or replace components effectively and easily, without requiring hard-wired connections. Patch panels also enable cables or connectors with such components to be installed and organized, and with shorter overall lengths.

Despite their advantages, however, patch panels tend to reduce the efficiency of storage within a rack. The use of patch panels in association with a rack necessarily reduces the number or size of components that may be housed within the rack, as the patch panels occupy physical space within the rack. Additionally, a rack that includes patch panels must also provide a buffer or space between the patch panels and any components therein, to accommodate cables or other connectors that are routed between such patch panels and such components. Moreover, currently, where a patch panel is hard-mounted to a frame of a rack, the patch panel must be removed prior to installing or replacing components therein, or prior to performing maintenance or inspection on any of such components. Given that patch panels are designed to receive electrical power or signals and to transfer such electrical power or signals to components within a rack, installing or replacing the components, or performing maintenance or inspection on such components, typically requires taking the patch panels and such components offline for a period of time.

BRIEF DESCRIPTION OF THE DRAWINGS

FIGS. 4A through 4D are views of components of one system including patch panel adapters in accordance with implementations of the present disclosure.

DETAILED DESCRIPTION

As is set forth in greater detail below, the present disclosure is directed to patch panel adapters or other movable systems for use in connection with data center racks. More specifically, the present disclosure is directed to one or more patch panels that are provided in association with a rack having one or more components housed therein. The patch panels may be mounted to adapters, or movable systems, having substantially planar constructions or configurations. The adapters permit the patch panels to receive connections from power sources, networks or other systems via substantially long cables (or long wires) on rear sides, or on sides facing away from an interior of a rack, and to make connections with components within the rack via substantially short cables (or short wires) on front sides, or on sides facing toward the interior of the rack.

Adapters of the present disclosure may be rotatable, pivotable or otherwise movable in nature. The adapters are constructed to permit patch panels to be placed within a vicinity of the components within a rack during normal operations, such as when power, network connectivity or other services are required to be provided to the components via the patch panels. When a component is to be installed within or removed from the rack, or when maintenance or other services are required within the rack, however, the adapters may be rotated, pivoted or otherwise moved away from the components within the rack, to provide sufficient clearance for installing or removing components, or for otherwise performing maintenance or other services, as necessary.

Referring to FIGS. 1A through 1F, views of components of one system 100 including a patch panel adapter 130 in accordance with implementations of the present disclosure are shown.

Figure 1A:
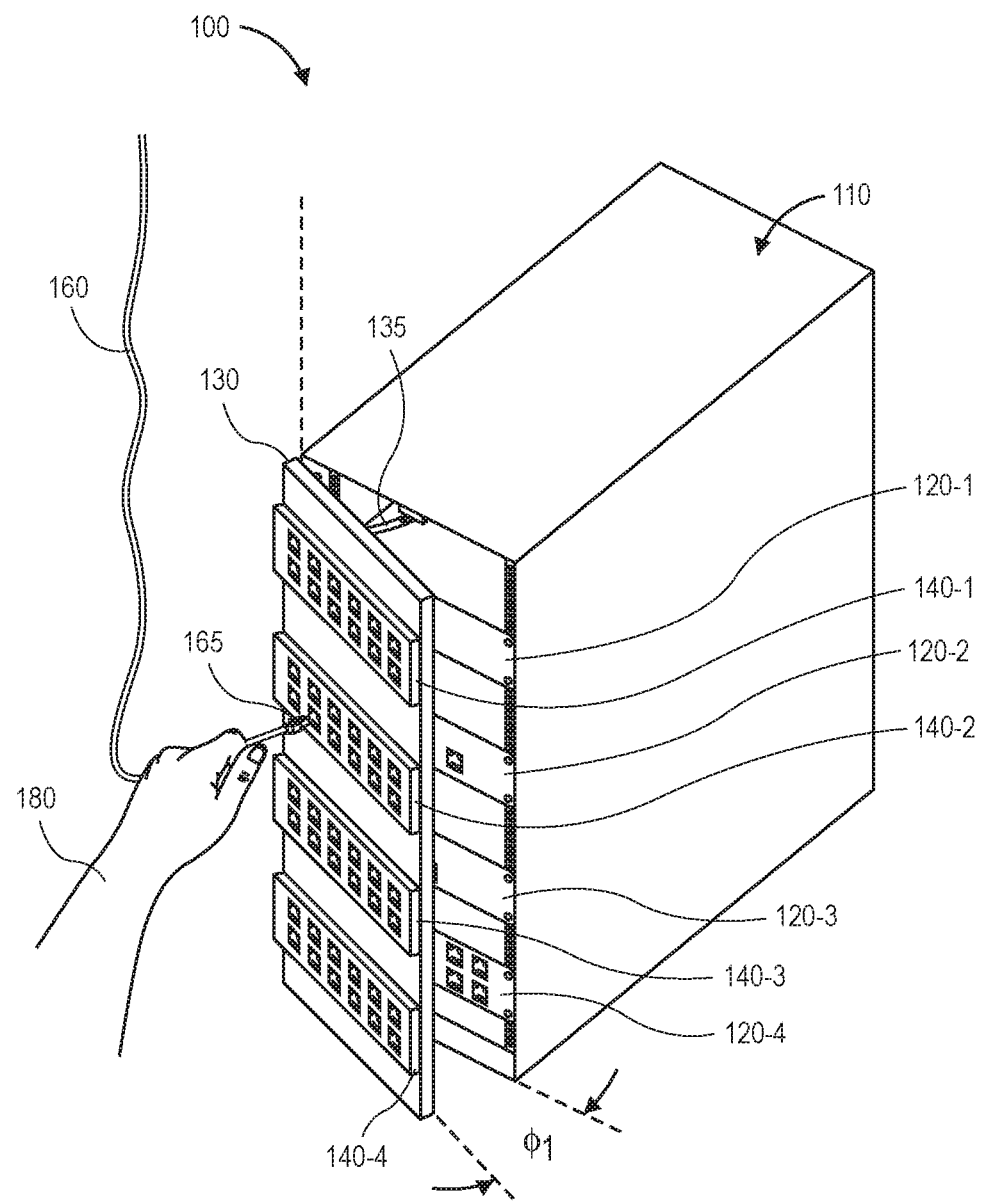
FIGS. 1A through 1F are views of components of one system including a patch panel adapter in accordance with implementations of the present disclosure.
Figure 1B:
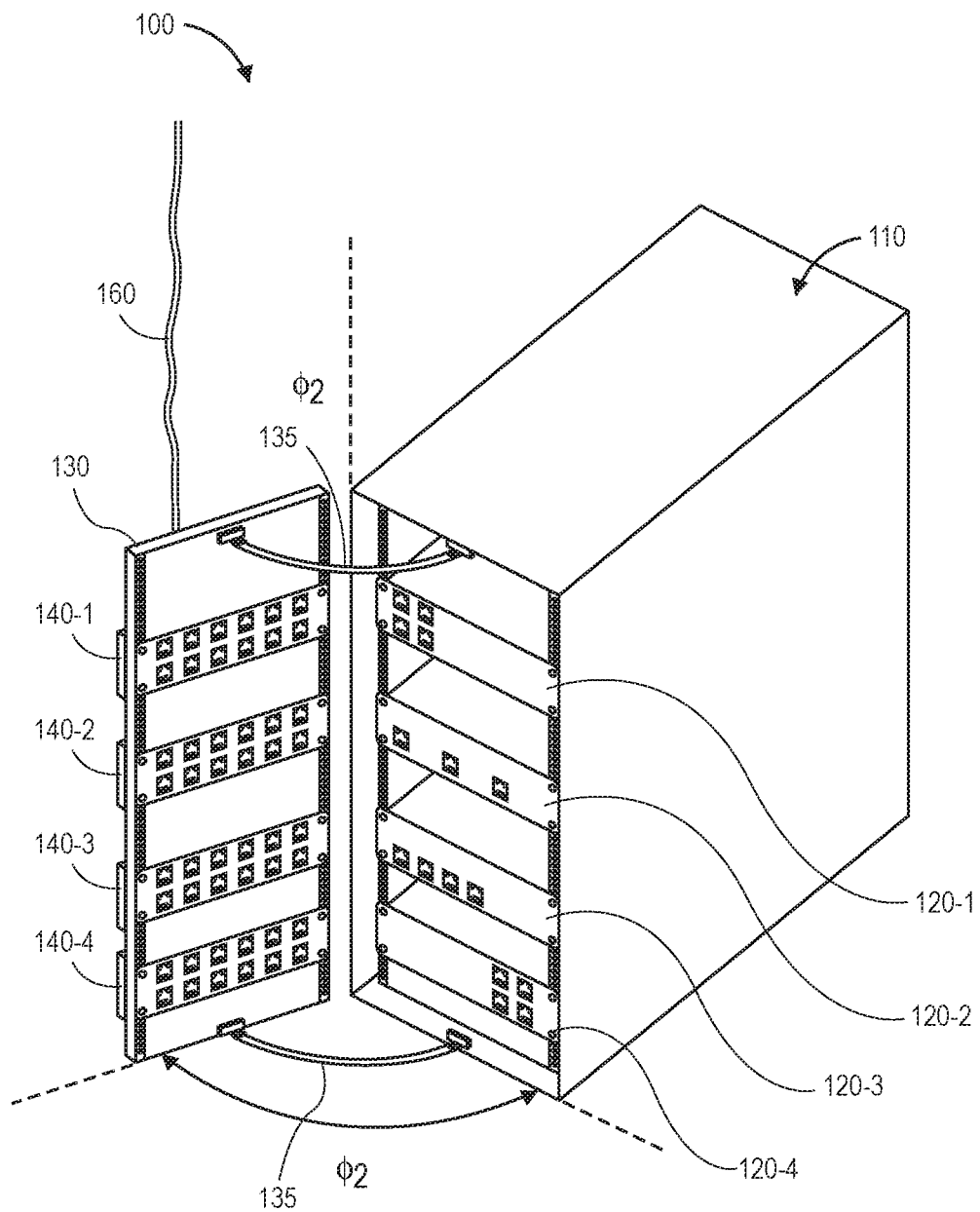

As is shown in FIGS. 1A and 1B, the system 100 includes a rack 110 and the adapter 130. The rack 110 may be a rigid frame or assembly formed from any number of panels that are aligned at any angle with respect to one another. Preferably, in some implementations, the rack 110 includes a frame defining all or portions of a rectangular hollow, with a pair of side panels having substantially equal heights and lengths, and with a top panel and a bottom panel having substantially equal lengths and widths. The rack 110 may further include any number of rails, tracks or other systems for receiving and supporting any number of components therein. Such rails, tracks or other systems may be mounted within the rack 110, to at least the side panels of the rack 110, by one or more screws, bolts, rivets, clamps, clips or other like fasteners, and aligned in parallel such that components may be inserted therein or removed therefrom.

For example, as is shown in FIGS. 1A and 1B, the rack 110 includes four components 120-1, 120-2, 120-3, 120-4 installed therein, e.g., in a stack or like vertical configuration. The components 120-1, 120-2, 120-3, 120-4 may include, but need not be limited to, one or more power supplies, server components, network switches, modems, transformers, or any other equipment. In accordance with implementations of the present disclosure, the rack 110 may be constructed or configured to provide support for any number of components therein, including numbers of components greater than or less than four (e.g., zero). For example, although the rack 110 includes four spaces for accommodating components therein, and each of such spaces is occupied by one of the components 120-1, 120-2, 120-3, 120-4, the rack 110 may include any number of such spaces. Moreover, in some implementations, each of such spaces may be occupied by a component, remain empty, or be covered or otherwise filled or occupied by a panel blank.

Additionally, as is also shown in FIGS. 1A and 1B, the adapter 130 is a substantially planar element that is movably mounted to the rack 110, e.g., by a pair of hinges 135. As is shown in FIGS. 1A and 1B, one of the hinges 135 is mounted at one end to or near an upper edge of the rack 110, substantially centrally between left and right panels of the rack 110, and to or near an upper edge of the adapter 130, substantially centrally between left and right edges of the adapter 130. Another of the hinges 135 is mounted at one end to or near a lower edge of the rack 110, substantially centrally between left and right panels of the rack 110, and to or near a lower edge of the adapter 130, substantially centrally between left and right edges of the adapter 130. Alternatively, the hinges 135 may be mounted to the rack 110 and the adapter 130 in any other location and in any other manner. For example, the hinges 135 may be mounted at or near either of the left panel of the rack 110 or the right panel of the rack 110, and at or near either of the left edge of the adapter 130 or the right edge of the adapter 130.

Each of the hinges 135 may be, or may share one or more attributes or properties of, articulating hinges, European hinges, frameless hinges, pie corner hinges, or others. For example, in some implementations, each of the hinges 135 may have one or more features that are similar to or consistent with a straight or curved friction support, thereby enabling the adapter 130 to move with respect to a front edge of the rack 110. For example, the adapter 130 may be fixedly or pivotably mounted to a friction support that is slidably mounted to a pin or other connection associated with the rack 110, such that the pin or other connection may travel within a track defined by the friction support as the adapter 130 is repositioned with respect to the rack 110, and the friction support may be inserted into or withdrawn from a cavity within the rack 110. Moreover, in some implementations, the adapter 130 may be mounted to ends of the hinges 135 in a manner that permits the adapter 130 to further pivot or rotate about an axis defined by such ends, regardless of a position of the adapter 130 with respect to a front edge of the rack 110.

In some implementations, any number of hinges 135 may be provided to movably mount the adapter 130 to the rack 110. For example, in addition to the hinges 135 provided at or near upper and lower edges of the rack 110 and the adapter 130, respectively, as shown in FIGS. 1A and 1B, hinges may be provided at any height or elevation along the rack 110 and the adapter 130. In some implementations, additional hinges may be desired to increase the loading capacity of the adapter 130, to enhance the strength, the stiffness or the rigidity of the adapter 130 with respect to the rack 110, or for any other purpose. Moreover, hinges may be mounted to the rack 110 at locations other than edges of the rack 110 in any manner, such as by mounting one end of a hinge to a panel blank or any other surface or system that may be inserted into or withdrawn from the rack 110, and another end of the hinge to the adapter 130 in any suitable location.

The adapter 130 includes a plurality of patch panels 140-1, 140-2, 140-3, 140-4 installed therein or thereon. As is shown in FIG. 1A, the adapter 130 and the patch panels 140-1, 140-2, 140-3, 140-4 define a plane that is aligned at an angle $\phi 1$ with respect to a plane defined by an open front edge of the rack 110. In some implementations, the adapter 130 has a length and width that substantially correspond to a length and width of an opening of the rack 110. In other implementations, the adapter 130 may have dimensions that do not correspond to any dimensions of the rack 110. In some implementations, the adapter 130 may have one or more surfaces that are aligned within a common plane with one face of one or more of the patch panels 140-1, 140-2, 140-3, 140-4. In some other implementations, surfaces of the adapter 130 and faces of the patch panels 140-1, 140-2, 140-3, 140-4 may be aligned within different planes.

Each of the patch panels 140-1, 140-2, 140-3, 140-4 includes one face or side having a number of jacks or ports for connecting with cables or wires, and another face or side (e.g., an opposing face or side) having an equal number of jacks or ports for connecting with cables or wires, such that each of the jacks or ports on one side of the one of the patch panels 140-1, 140-2, 140-3, 140-4 is internally coupled with one of the jacks or ports on the other face or side of the one of the patch panels 140-1, 140-2, 140-3, 140-4. As is shown in FIGS. 1A and 1B, the patch panels 140-1, 140-2, 140-3, 140-4 are installed in a manner that enables the patch panels 140-1, 140-2, 140-3, 140-4 to receive connections from power sources, networks or other systems via cables or wires on one side of the adapter 130, and to make connections with components via cables or wires on another side of the adapter 130.

As is also shown in FIG. 1A, a user 180 (or a worker, or an associate, or another operator) attempts to connect a cable 160 (e.g., a long cable) with the patch panel 140-2, by inserting a connector 165 into one of the jacks or ports on one face or side of the patch panel 140-2, e.g., a face or side of the patch panel 140-2 that faces away from the rack 110, or is provided farthest from the rack 110. The face or side of the patch panel 140-2 into which the user 180 attempts to insert the connector 165 is coplanar with the adapter 130.

In some implementations, where the cable 160 is connected to a network (e.g., an intranet or the Internet), the cable 160 may be an Ethernet cable such as a Category 3, Category 5, Category 5e, Category 6, Category 6a or Category 7 cable, and the connector 165 may be a male end of the cable 160, e.g., an 8P8C, 6P6C, 6P4C or 4P4C plug, that is configured for mating with one of the jacks or ports of the patch panel 140-2, e.g., an RJ11, RJ14, RJ25, RJ45S, RJ49, RJ61 jack or port. Alternatively, the cable 160 and the connector 165 may be any other type or form of cable or connector, respectively, that are configured to mate with a corresponding one of the jacks or ports. For example, the cable 160 may be a low-voltage cable having any number of cores and any type of insulation, or a cable having standard or nominal voltage capacities, e.g., one hundred ten volts (110 V) or two hundred twenty volts (220 V). The cable 160 may be grounded or ungrounded, and the connector 165 may have any number of pins, voltage ratings or current ratings. In some implementations, the cable 160 may be an audio or video cable, including but not limited to a telephone cable, a fiber optic cable, a speaker wire (of any gauge or length), an RCA cable, an F-pin cable, an S-video cable, a Y/C-cable, a coaxial cable, a Digital Visual Interface (or "DVI") cable, a High Definition Multimedia Interface (or "HDMI") cable, or any other cable.

Likewise, each of the patch panels 140-1, 140-2, 140-3, 140-4 may be provided for the purpose of receiving one or more of electrical power at standard or nominal voltage capacities, e.g., one hundred ten volts (110 V) or two hundred twenty volts (220 V), power at low voltages (e.g., Power over Ethernet), for making network connections of any type or form, for transmitting or receiving digital or analog data for use in audio or video applications, or for any other applications or purposes.

The rack 110 may have any dimensions in accordance with implementations of the present disclosure. For example, in some implementations, the rack 110 may have a height of approximately ten feet (10'), a depth of approximately three to four feet (3'-4'), and a width of approximately two feet (2'), or twenty-four inches (24"). Alternatively, the rack 110 may have any other dimensions. Likewise, dimensions of the components 120-1, 120-2, 120-3, 120-4 may be consistent with internal dimensions of the rack 110, in order to releasably accommodate the components 120-1, 120-2, 120-3, 120-4 therein in a secure manner. For example, in some implementations, the components 120-1, 120-2, 120-3, 120-4 may have a width of approximately nineteen inches (19"), and lengths that are less than an internal depth of the rack 110.

Moreover, portions of the rack 110 or the adapter 130, e.g., panels and/or rails, tracks or other systems for accommodating the components, may be formed from any suitable materials and in any manner. For example, in some implementations, portions of the rack 110 or the adapter 130 may be formed from steel of any thickness or gauge, e.g., fourteen-gauge steel, or steel having a thickness within a range of approximately 0.050 to 0.100 inches, which may be anodized or otherwise treated in any manner. In some other implementations, components of the assembly 110 or the adapter 130 may be formed from aluminum or aluminum alloys, e.g., aluminum 6063 (or A6063), or from metals other than aluminum, and having any thickness. In some other implementations, the frames may be formed from plastics (e.g., thermosetting plastics such as epoxy or phenolic resins, polyurethanes or polyesters, as well as polyethylenes, polypropylenes or polyvinyl chlorides), wood (e.g., woods with sufficient strength properties such as ash), glass, composites or any other combinations of materials. The components of the rack 110 or the adapter 130 may be formed by extrusion (e.g., hot or cold), rolling, forging, drawing, bending or shearing, or any other processes.

As is shown in FIG. 1B, the adapter 130 may be configured to move from a position or orientation near the components in the rack 110, e.g., at the angle $\phi 1$ with respect to the plane defined by the open front edge of the rack 110, to a position or orientation sufficiently remote from the components in the rack 110, e.g., at an angle $\phi 2$ with respect to the plane defined by the open front edge of the rack 110. As is also shown in FIG. 1B, each of the patch panels 140-1, 140-2, 140-3, 140-4 has a plurality of jacks or ports for connecting to one or more of the components 120-1, 120-2, 120-3, 120-4, e.g., via cables or wires, on a face or side of the adapter 130 nearest the components 120-1, 120-2, 120-3, 120-4.

Figure 1C:
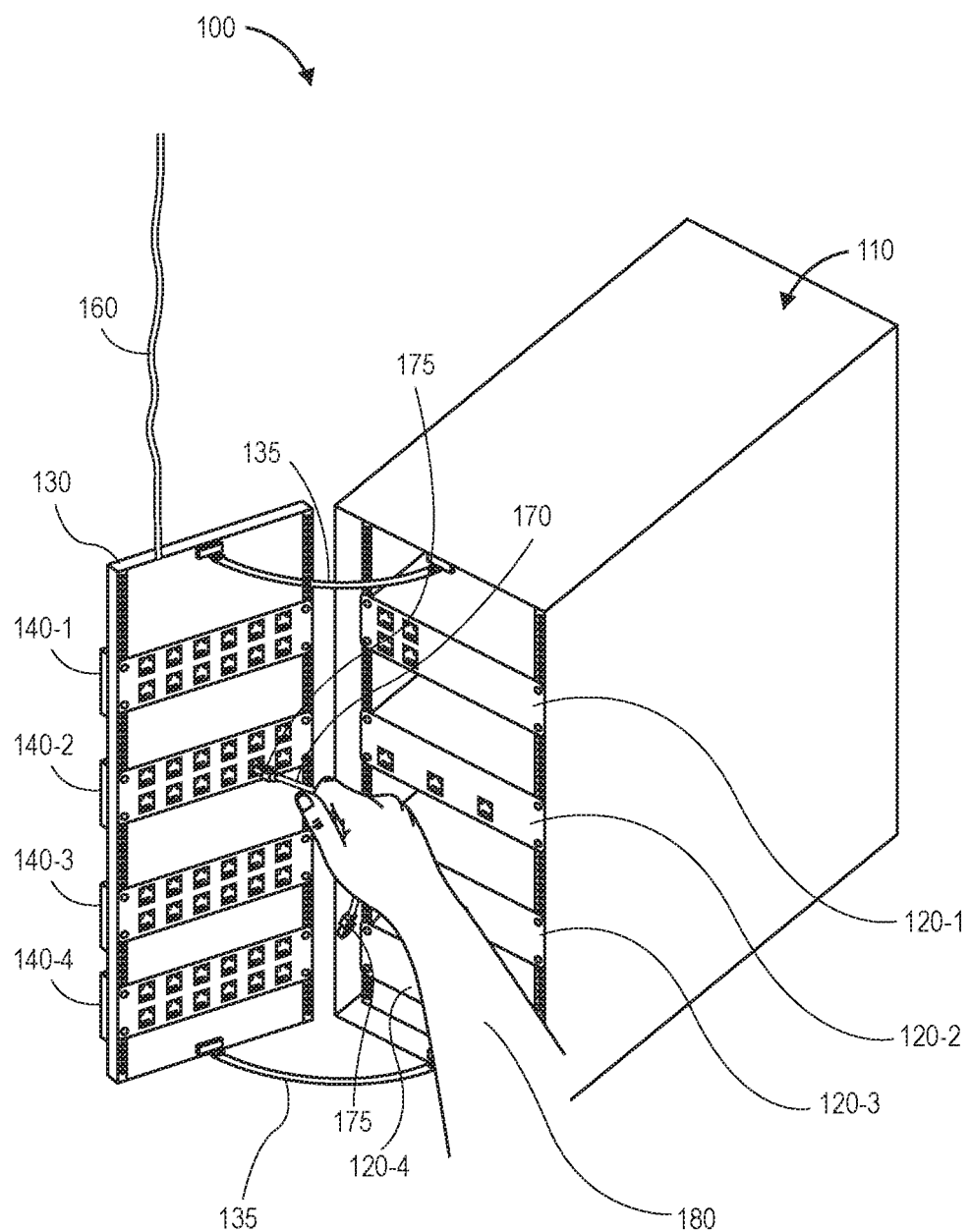

As is shown in FIG. 1C, the patch panels 140-1, 140-2, 140-3, 140-4 are installed in a manner that enables the patch panels 140-1, 140-2, 140-3, 140-4 to receive connections from power sources, networks or other systems via cables or wires on one side of the adapter 130, and to make connections with components via cables or wires on another side of the adapter 130. For example, as is shown in FIG. 1C, the user 180 attempts to connect a cable 170 (e.g., a short cable) with the patch panel 140-2, by inserting a connector 175 into one of the jacks or ports on another face or side of the patch panel 140-2, e.g., a face or side of the patch panel 140-2 facing toward the rack 110, or provided closest to the rack 110. The cable 170 and/or the connector 175 may be of the same type or quality as the cable 160 and/or the connector 165, or may share one or more properties or attributes in common with the cable 160 and/or the connector 165. In some implementations, the cable 170 may be significantly shorter in length than the cable 160. Additionally, the user 180 may insert the connector 175 into a jack or port of the patch panel 140-2 that corresponds to the jack or port of the patch panel 140-2 into which the connector 165 of the cable 160 is inserted, e.g., on an opposite face or side of the patch panel 140-2.

Figure 1D:
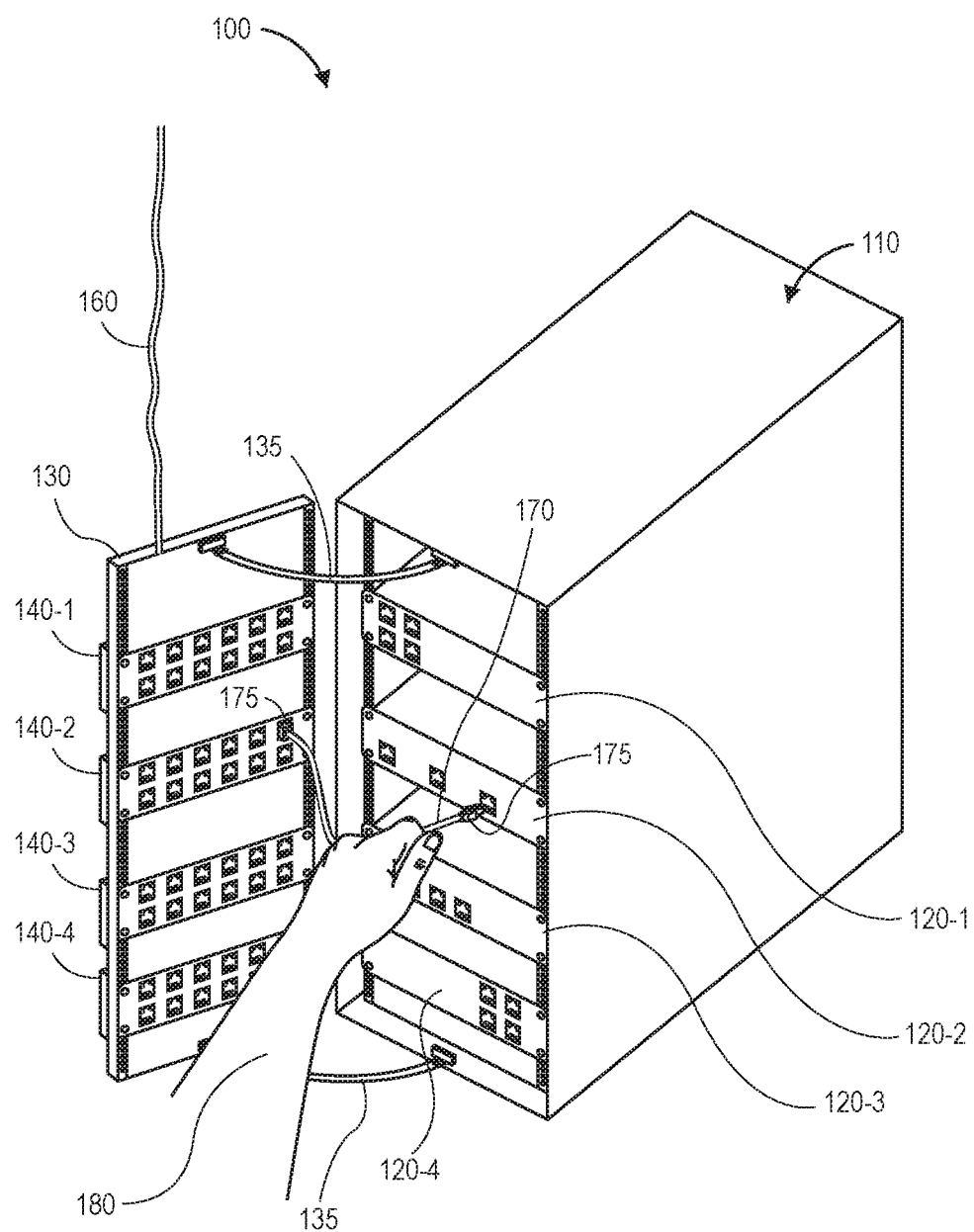

As is shown in FIG. 1D, after inserting one connector 175 of the cable 170 into one of the jacks or ports of the patch panel 140-2, the user 180 inserts another connector 175 of the cable 170 into a corresponding jack or port of the component 120-2 within the rack 110. Upon inserting the connector 175 of the cable 170 into the jack or port of the component 120-2, the component 120-2 may be aligned to receive power, network connectivity or other services from a source to which the cable 160 is connected, via the cable 160, the patch panel 140-2 and the cable 170.

With the adapter 130 in the position shown in FIGS. 1B through 1D, the user 180 may access any number of the components 120-1, 120-2, 120-3, 120-4 within the rack 110, to perform replacement, maintenance or inspection operations on such components 120-1, 120-2, 120-3, 120-4. The user 180 may also access faces or sides of the patch panels 140-1, 140-2, 140-3, 140-4 that are nearest the components 120-1, 120-2, 120-3, 120-4, e.g., to connect one of the patch panels 140-1, 140-2, 140-3, 140-4 with one or more of the components 120-1, 120-2, 120-3, 120-4 by one or more cables 170. Where the rack 110 is provided adjacent or to or otherwise in association with one or more other racks (not shown), the adapter 130 may temporarily inhibit access to one or more other racks, e.g., a rack provided on a left side of the rack 110 (not shown), while enabling access to the components 120-1, 120-2, 120-3, 120-4 or the faces or sides of the patch panels 140-1, 140-2, 140-3, 140-4.

Figure 1E:
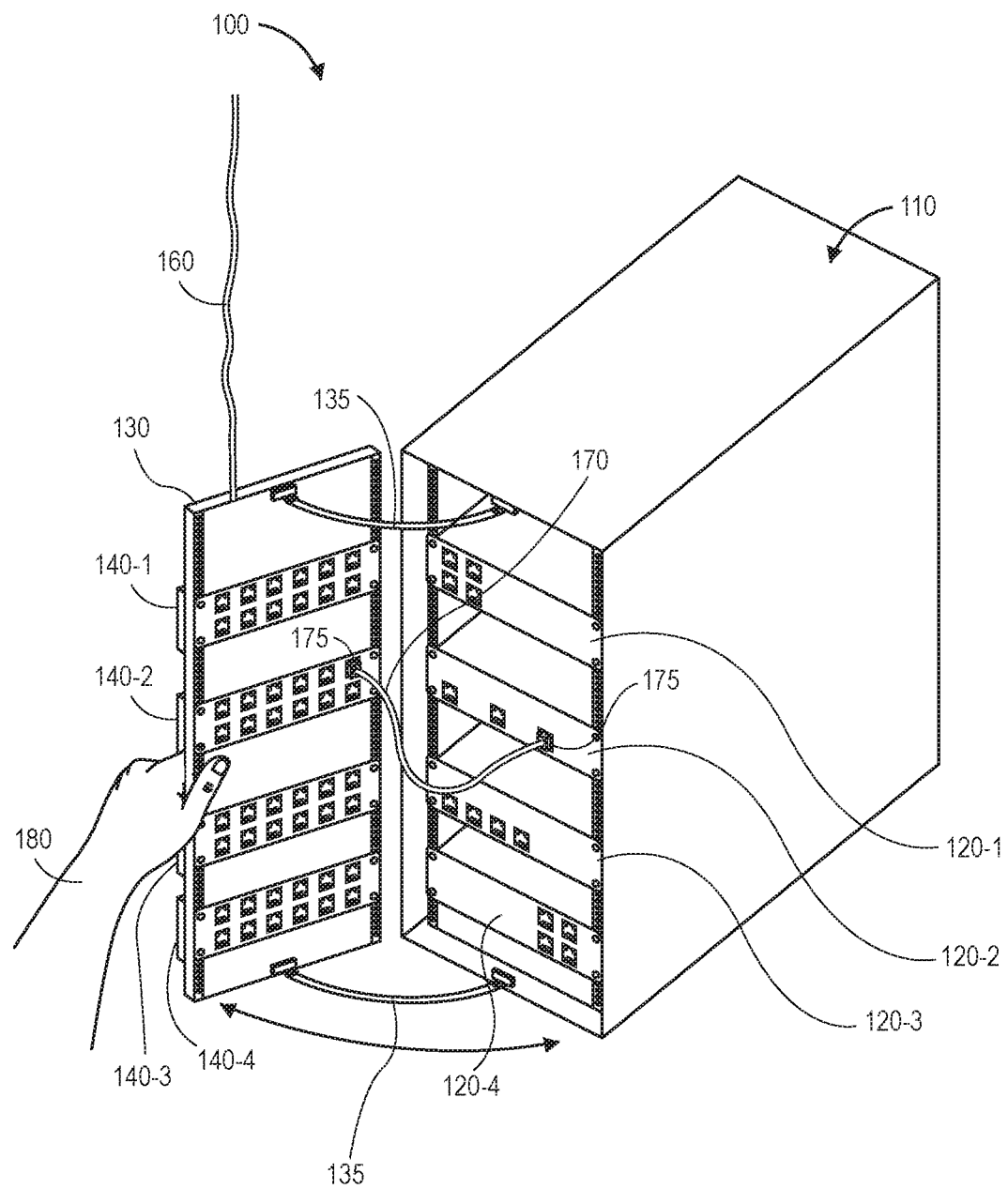
Figure 1F:
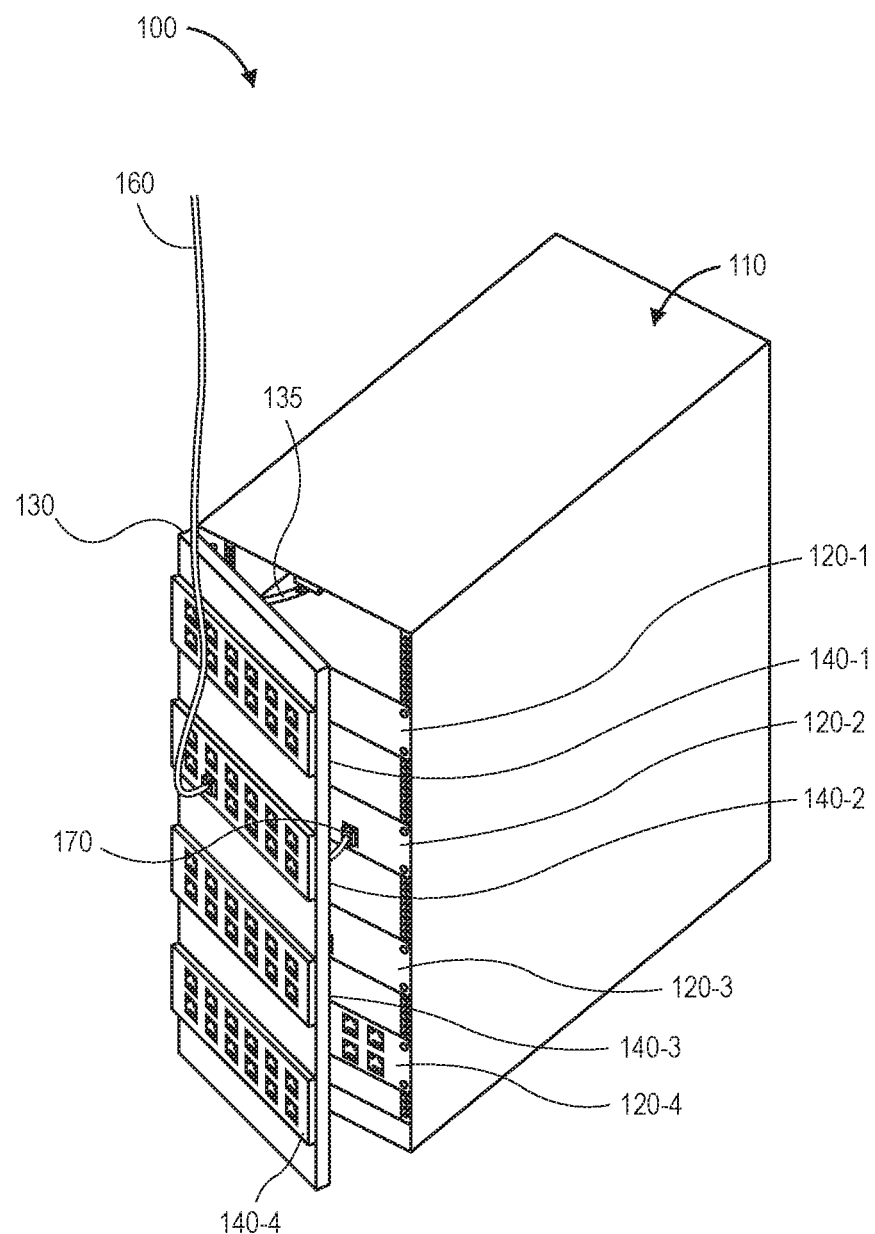

As is shown in FIGS. 1E and 1F, after connecting the cable 160 to the patch panel 140-2, and after connecting the cable 170 to the patch panel 140-2 and the component 120-2, the user may pivot the adapter 130 and the patch panels 140-1, 140-2, 140-3, 140-4 to the angle or to any other angle. Subsequently, the component 120-2 may continue to receive services via the cable 170 and the patch panel 140-2. To the extent that any of the components 120-1, 120-2, 120-3, 120-4 requires replacement, maintenance or inspection, or any of the components 120-1, 120-2, 120-3, 120-4 is to be connected to one or more services via one or more of the patch panels 140-1, 140-2, 140-3, 140-4, the adapter 130 and the patch panels 140-1, 140-2, 140-3, 140-4 may be moved or pivoted to the angle $\phi 1$ or to any other angle, as necessary, and one or more cables or other connectors, which may be similar or identical to the cable 160 and the cable 170, may be connected to any of the patch panels 140-1, 140-2, 140-3, 140-4 and corresponding ones of the components 120-1, 120-2, 120-3, 120-4, as necessary. With the adapter 130 in the position shown in FIG. 1F, the adapter 130 does not inhibit access to any other racks (not shown), such as racks that are adjacent to the rack 110, or otherwise provided in association with the rack 110.

Adapters of the present disclosure may be mounted in association with racks (e.g., data center racks) in any manner in accordance with the present disclosure. Referring to FIGS. 2A through 2H, views of components of one system 200 including a patch panel adapter 230 in accordance with implementations of the present disclosure are shown. Except where otherwise noted, reference numerals preceded by the number "2" shown in FIGS. 2A through 2H indicate components or features that are similar to components or features having reference numerals preceded by the number "1" shown in FIGS. 1A through 1F.

Figure 2A:
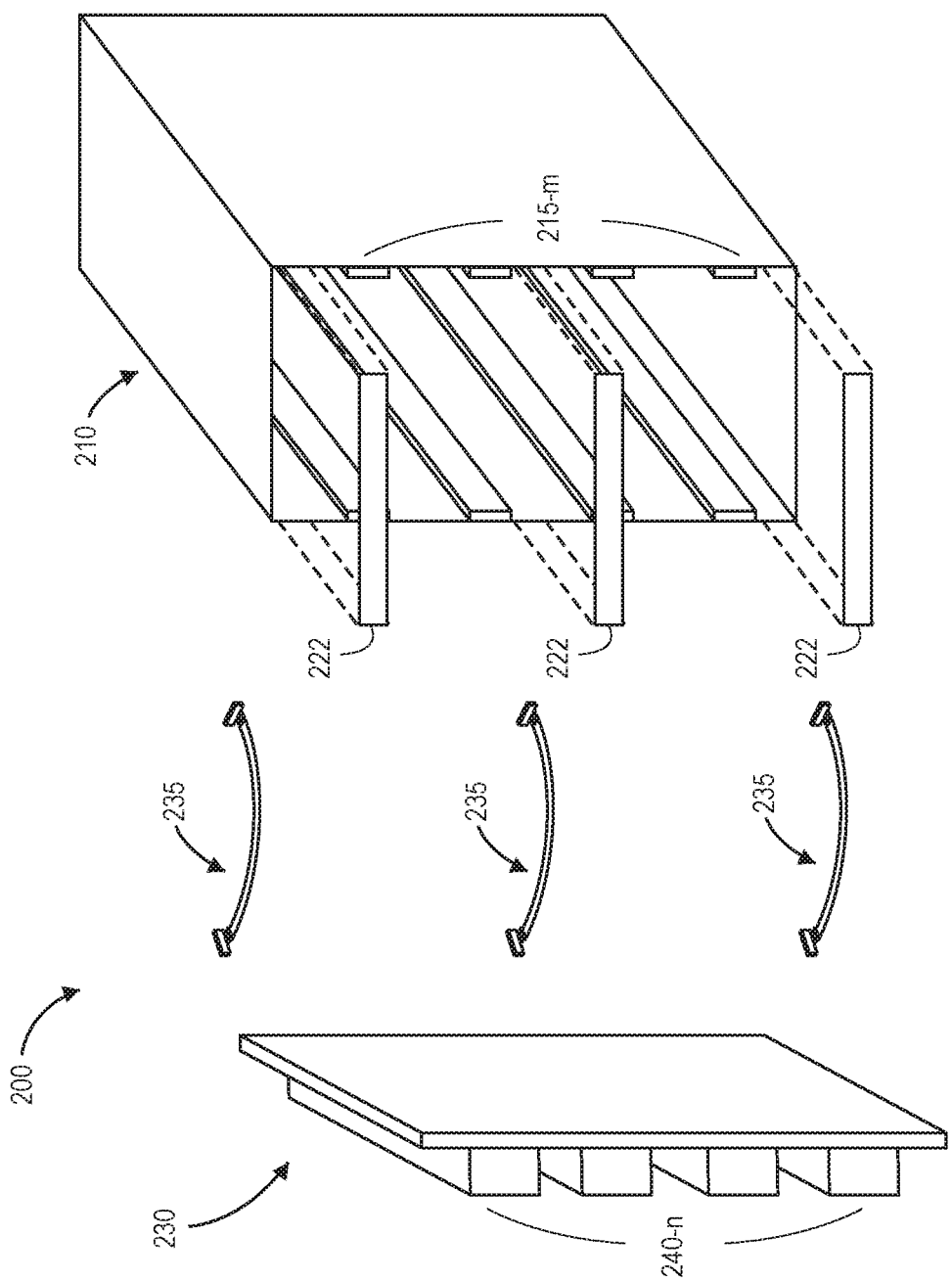
FIGS. 2A through 2H are views of components of one system including a patch panel adapter in accordance with implementations of the present disclosure.

As is shown in FIG. 2A, a rack 210 includes a plurality of pairs of rails 215-$m$ on interior surfaces of side panels. Each of the rails 215-$m$ of a pair is aligned at a common height with respect to a bottom panel or a top panel of the rack 210. Alternatively, the pairs of the rails 215-$m$ may be mounted to posts or other components of the rack 210.

Additionally, as is also shown in FIG. 2A, the adapter 230 has a plurality of patch panels 240-$n$ mounted thereto. The patch panels 240-$n$ include corresponding sets of jacks or ports on opposing faces or sides of each of the patch panels 240-$n$. Power, network connectivity or other services may be provided via any of the patch panels 240-$n$, such as by inserting a connector of a cable or other connector associated with power, network connectivity or other services into one of the jacks or ports on one of the faces or sides of one of the patch panels 240-$n$, and inserting another cable or other connector into a corresponding one of the jacks or ports on the other face or side of the one of the patch panels 240-$n$.

As is further shown in FIG. 2A, the rack 210 includes a plurality of panel blanks 222. The adapter 230 may be rotatably or pivotably mounted to the rack 210 by one or more hinges 235, each of which has one end mounted to the adapter 230, and another end mounted to one of the panel blanks 222. In some embodiments, the panel blanks 222 may be applied over an opening or other space within the rack 210 that may be sized or configured to accommodate a component therein. Alternatively, in some other embodiments, the panel blanks 222 may be configured with corresponding sets of tracks or other systems that may be inserted into or onto one or more of the sets of rails 215-$m$, e.g., in lieu of a component.

The hinges 235 may be of any type or form, and may be adapted or configured to mount the adapter 230 to the panel blanks 222 at any location on or with respect to the rack 210, e.g., at any height or elevation between a top panel of the rack 210 and a bottom panel of the rack 210, or to enable the adapter 230 to pivot to any position or angle of within a range of positions or angles with respect to a front edge of the rack 210. In some implementations, the hinges 235 may be, or may share one or more attributes or properties of, articulating hinges, European hinges, frameless hinges, pie corner hinges, or others. Alternatively, or additionally, the hinges 235 may include one or more straight or curved friction supports, mating pairs of rails or other systems which enable to the adapter 230 to be positioned within close proximity of a front edge of the rack 210, or positioned away from and fully clear of the front edge of the rack 210, in order to enable one or more components to be installed therein or removed therefrom, or maintenance or inspections to be performed on such components. Portions of the hinges 235 may be configured for insertion into or withdrawal from the rack 210 as the adapter 230 is repositioned with respect to the rack 210. Additionally, the adapter 230 may be fixedly or pivotably mounted to ends or other portions of the hinges 235 in a manner that permits the adapter 230 to further pivot or rotate about an axis defined by such ends or portions, regardless of a position of the adapter 230 with respect to a front edge of the rack 210.

Figure 2B:
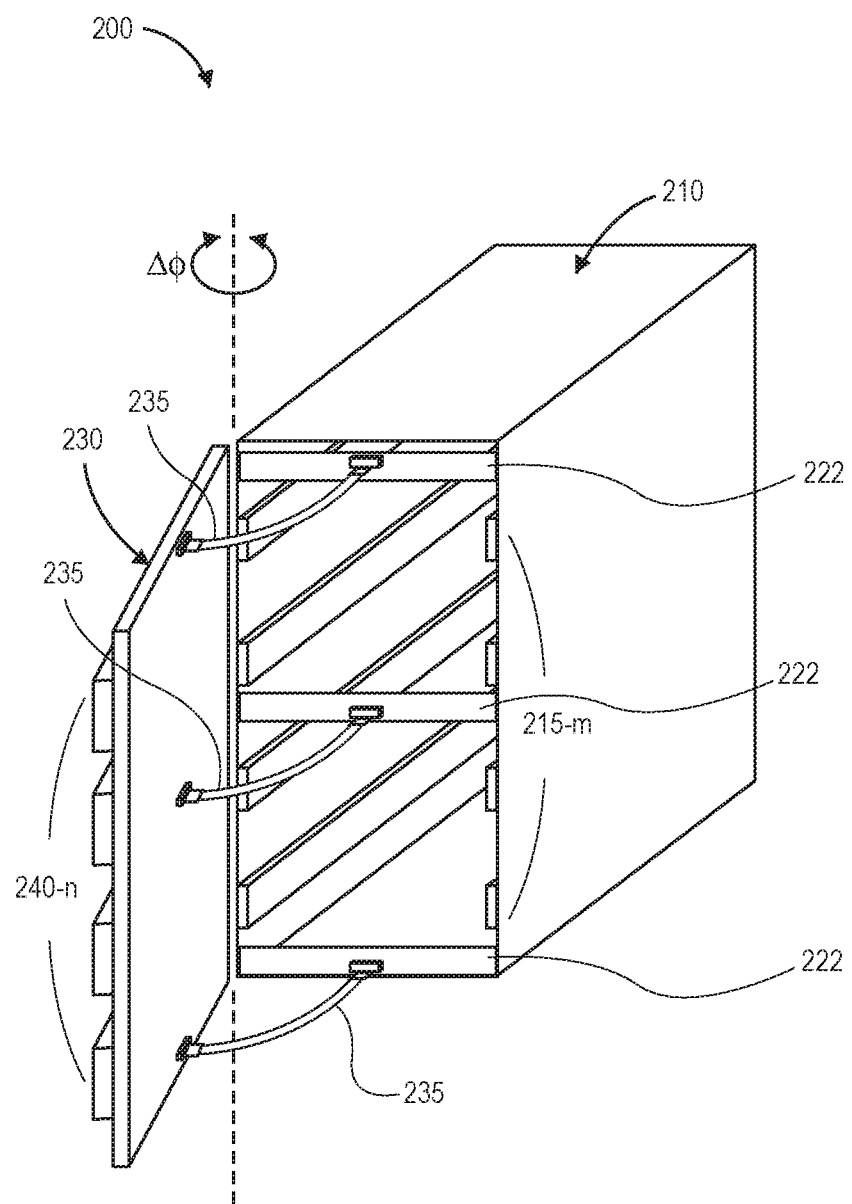

As is shown in FIG. 2B, with the adapter 230 movably mounted to the rack 210 by the hinges 235, the adapter 230 and the plurality of patch panels 240-$n$ may be moved about a range of angles $\Delta\phi$ or to a range of positions with respect to the front edge of the rack 210 and any components resting on the pairs of rails 215-$m$ therein.

Figure 2D:
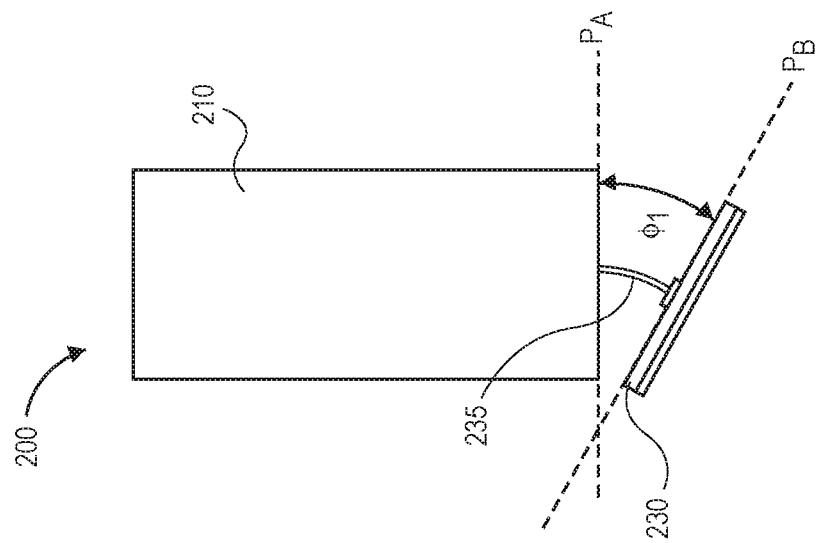
Figure 2C:
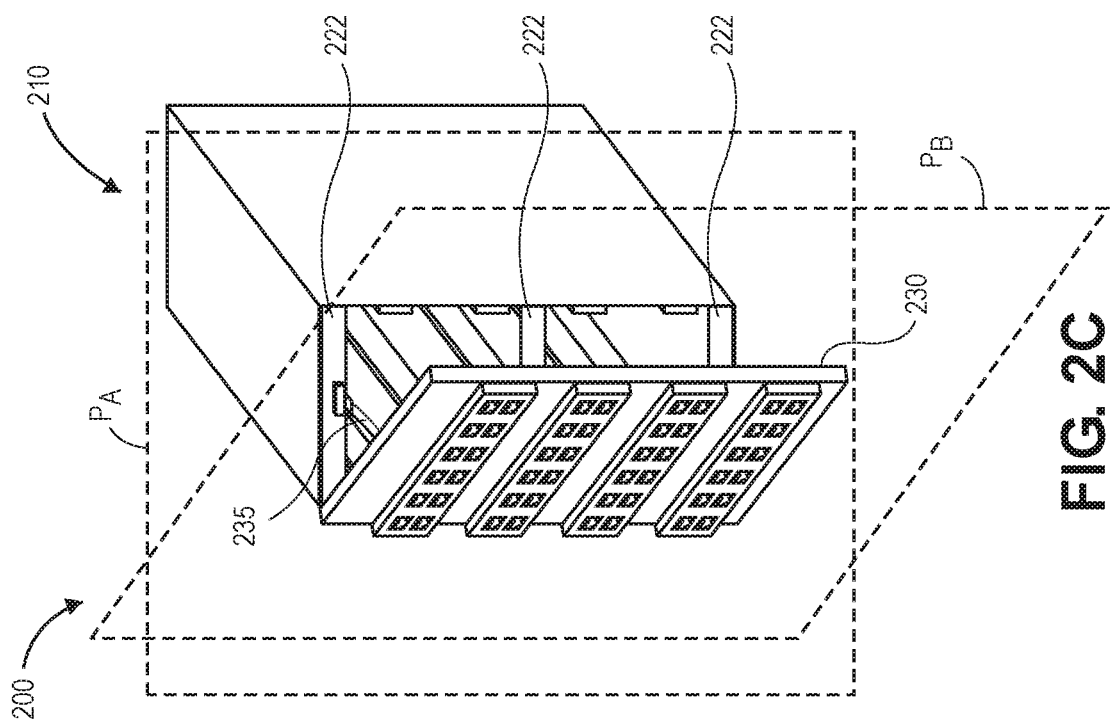

For example, as is shown in FIGS. 2C and 2D, the adapter 230 may be placed in a position with respect to the rack 210 such that a plane $P_A$ defined by the adapter 230 and the patch panels 240-$n$ is aligned at an angle $\phi_1$ (e.g., a dihedral angle) with respect to a plane $P_B$ defined by the front edge of the rack 210. With the adapter 230 and the patch panels 240-$n$ in the position shown in FIGS. 2C and 2D, and aligned at the angle $\phi_1$, which is acute, any components (not shown) resting on one or more pairs of the rails 215-$m$ of the rack 210 may receive power, network connectivity or other services by way of any of the patch panels 240-$n$ and any cables or other connectors that are connected to opposing faces or sides thereof, such as is shown in FIGS. 1E and 1F.

Figure 2F:
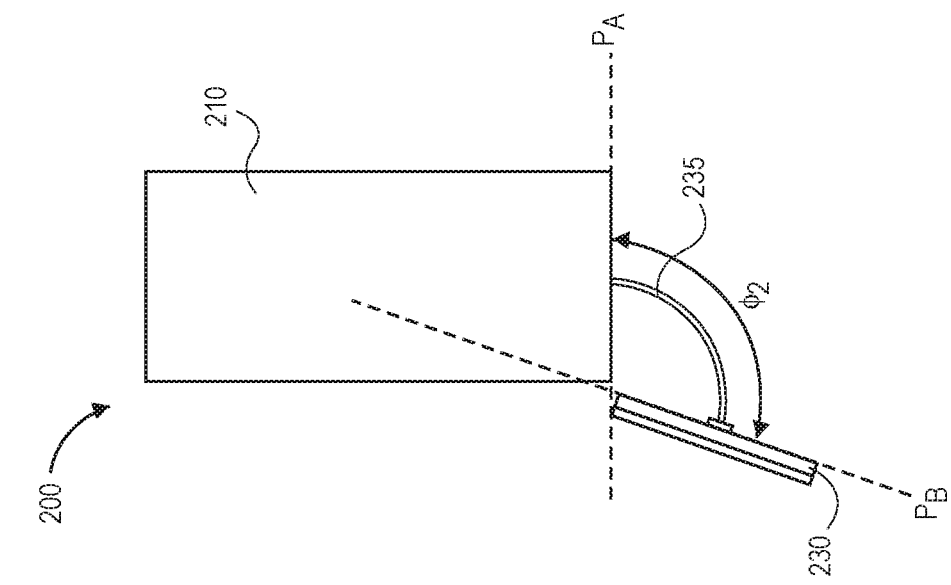
Figure 2E:
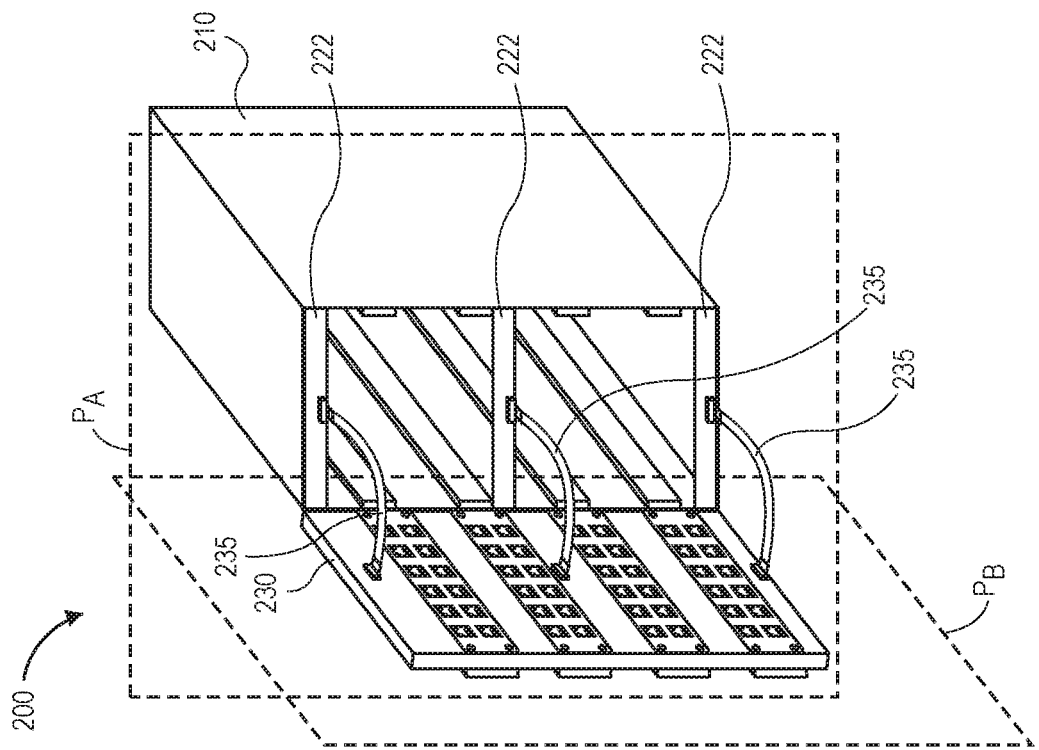

As is shown in FIGS. 2E and 2F, however, the adapter 230 may also be placed in a position with respect to the rack 210 such that the plane $P_A$ defined by the adapter 230 and the patch panels 240-$n$ is aligned at an angle $\phi_2$ (e.g., a dihedral angle) with respect to the plane $P_B$ defined by the front edge of the rack 210. With the adapter 230 and the patch panels 240-$n$ in the position shown in FIGS. 2E and 2F, and aligned at the angle $\phi_2$, which is obtuse, one or more components may be installed within the rack 210 or removed therefrom, and any cables or other connectors may be connected to one of the patch panels 240-$n$ and any of such components, as the adapter 230 is sufficiently free and clear of the front edge of the rack 210.

Figure 2G:
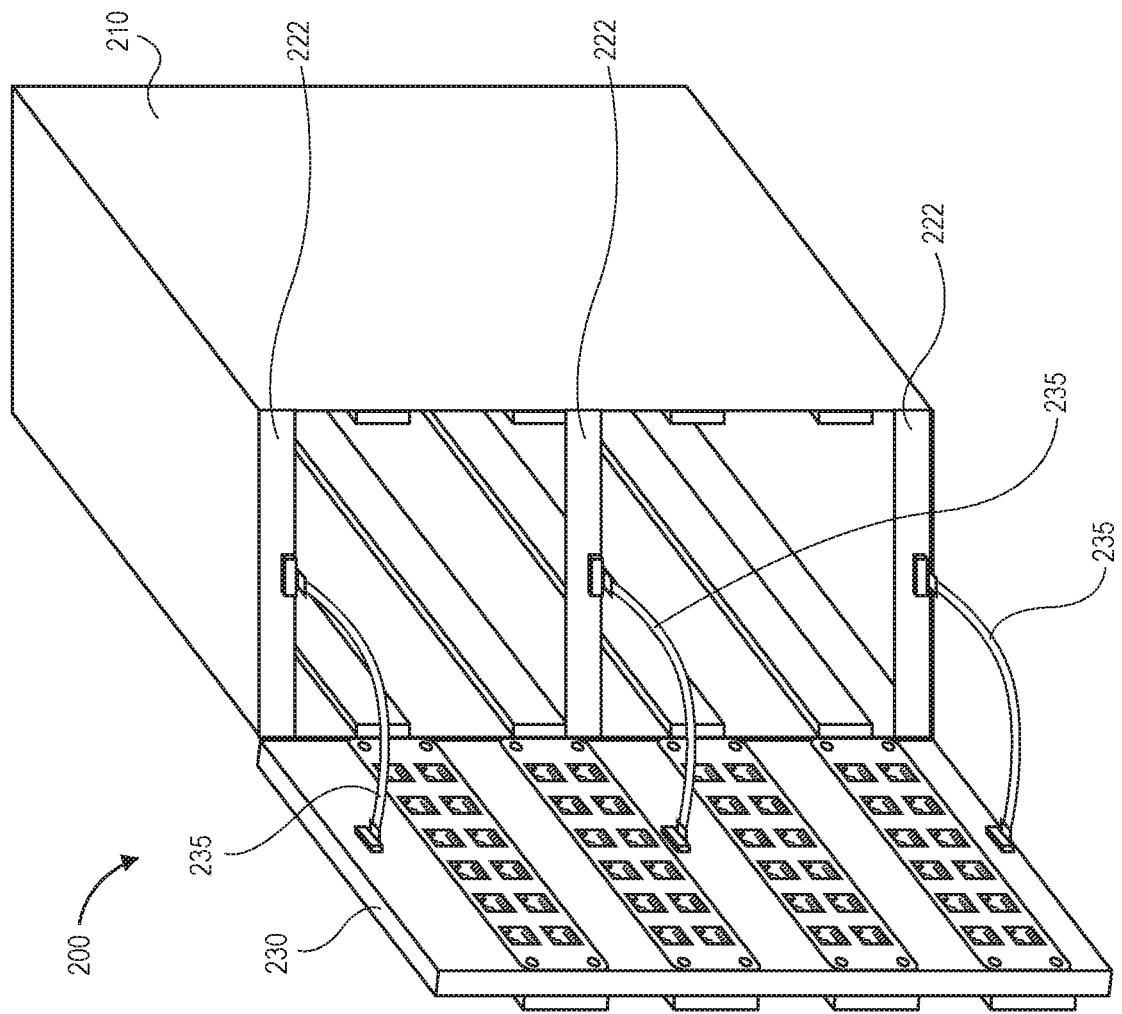
Figure 2G:
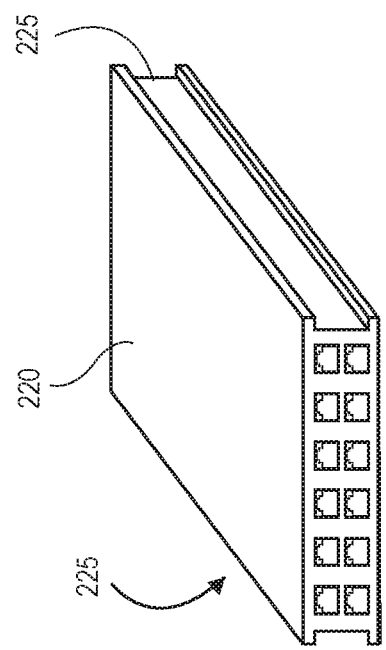
Figure 2H:
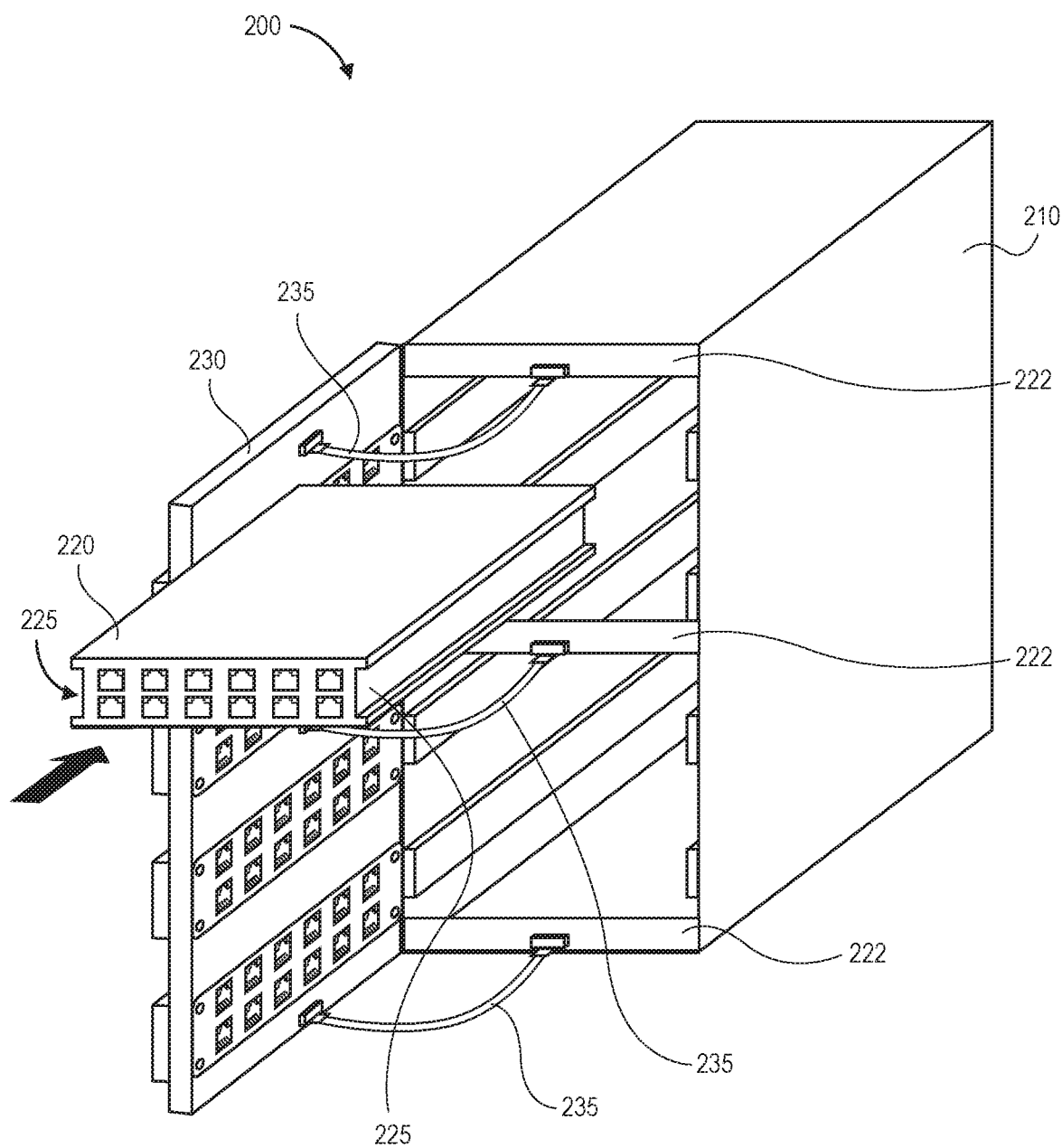

For example, as is shown in FIGS. 2G and 2H, a server 220 or other component having dimensions corresponding to an interior of the rack 210 and the rails 215-$m$ therein may be inserted into the rack 210 by aligning a pair of the rails 215-$m$ with corresponding tracks 225 within edges of the server 220. In some implementations, the server 220 may have a width of approximately nineteen inches (19"), and the tracks 225 and the rails 215-$m$ may be separated by a corresponding width that is also approximately nineteen inches (19"), or slightly less than nineteen inches (19"), but sufficiently wide to provide adequate support for the server 220. Alternatively, any number of other servers or similarly sized components may be inserted into the rack 210 or removed therefrom with the adapter 230 aligned at the angle $\phi_2$, or any other angle, when the adapter 230 and the patch panels 240-$n$ are sufficiently free and clear of the front edge of the rack 210.

Figure 3A:
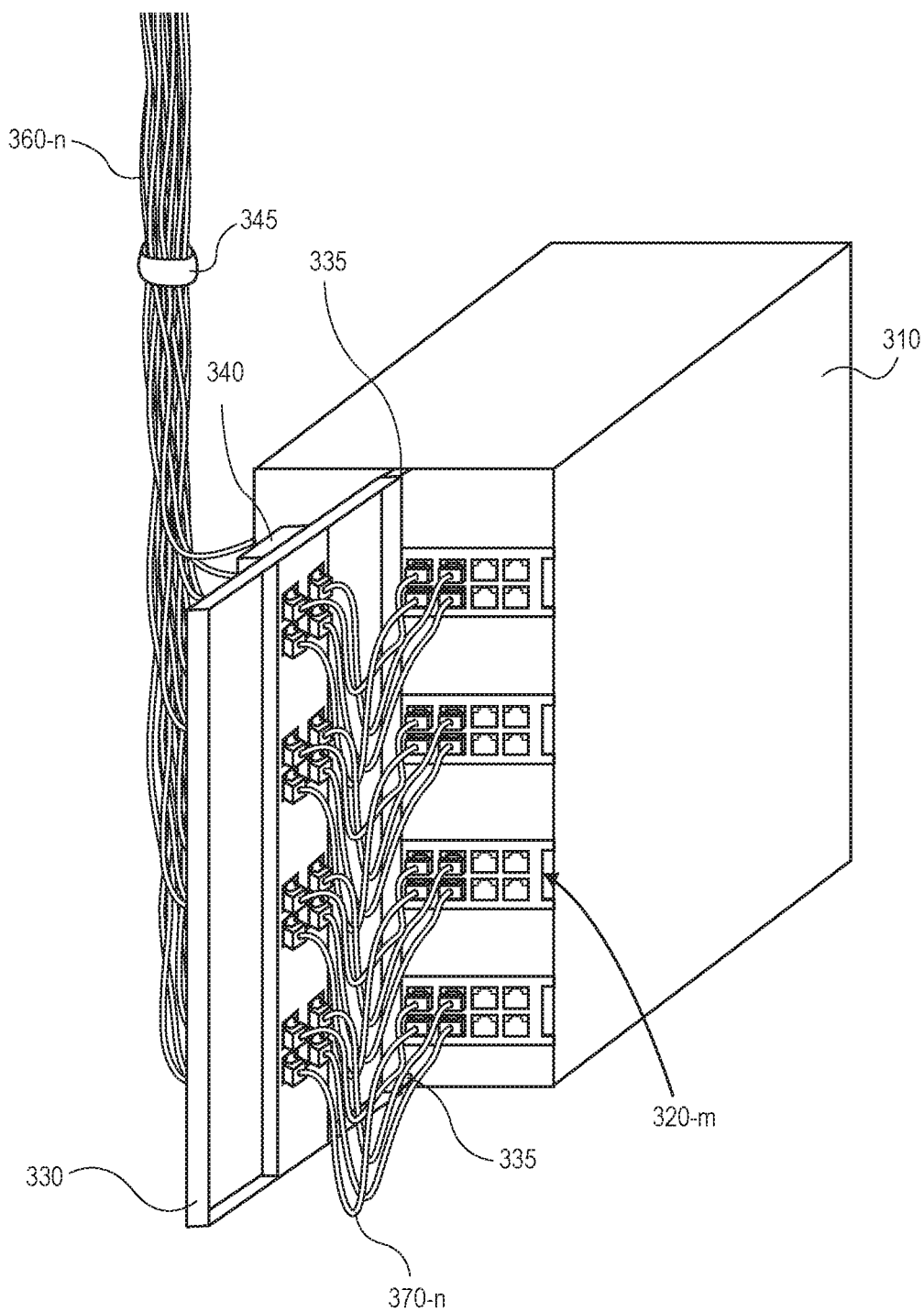
FIGS. 3A and 3B are views of components of one system including a patch panel adapter in accordance with implementations of the present disclosure.
Figure 3B:
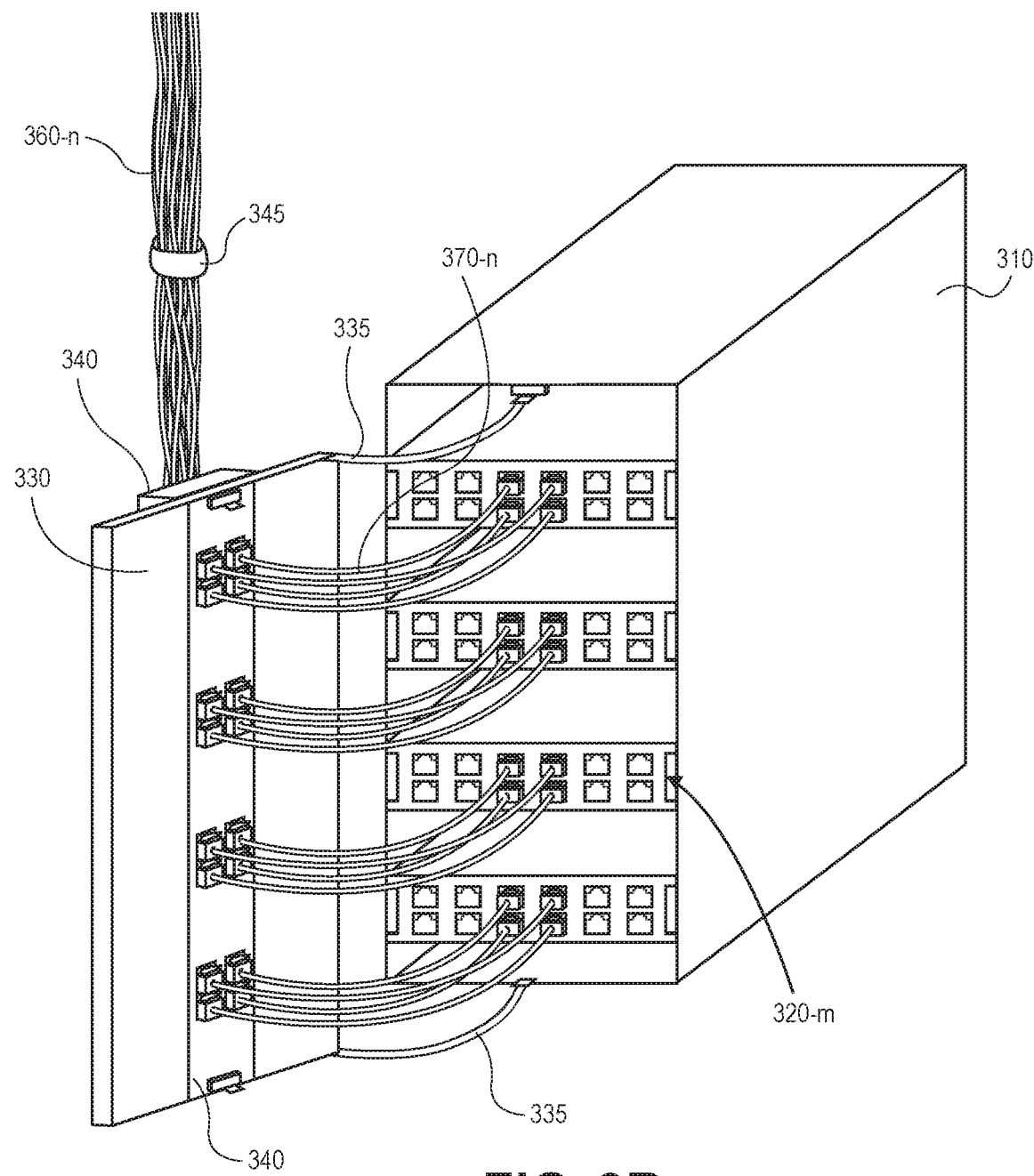

In accordance with implementations of the present disclosure, patch panels may be aligned in any orientations with respect to adapters to which the patch panels are mounted, and may be configured to receive any number of cables or other connectors on faces or sides thereof, in order to provide services to one or more components within racks to which the adapters are mounted. Likewise, the adapters may be movably mounted to racks or other systems in a manner that permits the adapters to be placed in a range of positions or aligned within a range of angles with respect to such racks or other systems. Referring to FIGS. 3A and 3B, views of components of one system 300 including a patch panel adapter 330 in accordance with implementations of the present disclosure are shown.

As is shown in FIGS. 3A and 3B, the system 300 includes a rack 310 and the adapter 330, which is rotatably or pivotably mounted to the rack 310. A patch panel 340 is mounted to the adapter 330, and aligned substantially vertically with respect to the adapter 330. Alternatively, the patch panel 340 may be aligned substantially horizontally with respect to the adapter 330, such as is shown in FIG. 1B or 2B, or at any other orientation with respect to the adapter 330. As is also shown in FIGS. 3A and 3B, the adapter 330 is coupled to the rack 310 by a pair of friction supports 335 that are slidably mounted at or near a front edge of the rack 310, at upper and lower panels of the rack 310, respectively. The friction supports 335 are also pivotably or rotatably mounted to one edge of the adapter 330, thereby enabling the adapter 330 to pivot or rotate with respect to an axis defined by the ends of the friction supports 335 to which the adapter is mounted.

As is further shown in FIG. 3A, the adapter 330 is aligned with one edge in a position proximate a front edge of the rack 310 and a plurality of components 320-$m$ therein, substantially normal or perpendicular to the front edge of the rack 310. A plurality of cables 360-$n$ (e.g., long cables) have connectors inserted into jacks or ports within one face or side of the patch panel 340, while a plurality of cables 370-$n$ (e.g., short cables) have connectors inserted into corresponding jacks or ports within an opposing face or side of the patch panel 340, and also into jacks or ports of the plurality of components 320-$m$ that are installed within the rack 310. The components 320-$m$ may include one or more power supplies, servers, switches, fans or other cooling systems, or other electronic components. As is also shown in FIG. 3A, the cables 360-$n$ may be bound by a tie 345 (or clip) or other system or component that functionally and releasably bundles the cables 360-$n$ into a common unit.

As is shown in FIG. 3B. the adapter 330 is aligned in a position remote from the front edge of the rack 310 and the components 320-$m$ therein, and at a substantially normal or perpendicular angle with respect to the front edge of the rack 310. The friction supports 335 extend from the rack 310, and the adapter 330 is permitted to rotate about an axis defined by the ends of the friction supports 335 to which the adapter 330 is mounted.

With the adapter 330 and the patch panel 340 in the position and orientation shown in FIG. 3B, any of the components 320-$m$ mounted within the rack 310 may be removed, e.g., by removing connectors of corresponding ones of the cables 370-$n$ from one of the components 320-$m$, and sliding or otherwise removing the one of the components 320-$m$ from the rack 310. Subsequently, another component (not shown) may be reinserted into a slot or an opening from which the one of the components 320-$m$ was removed, and connected to power, network connectivity or other services by inserting connectors of a cable into a jack or a port on the patch panel 340, and a jack or a port on the component inserted therein.

Any number of racks having power patch assemblies of the present disclosure may be utilized together in accordance with implementations of the present disclosure. Referring to FIGS. 4A through 4D, views of components of one system 400 including patch panel adapters 430-$n$ in accordance with implementations of the present disclosure are shown.

Figure 4A:
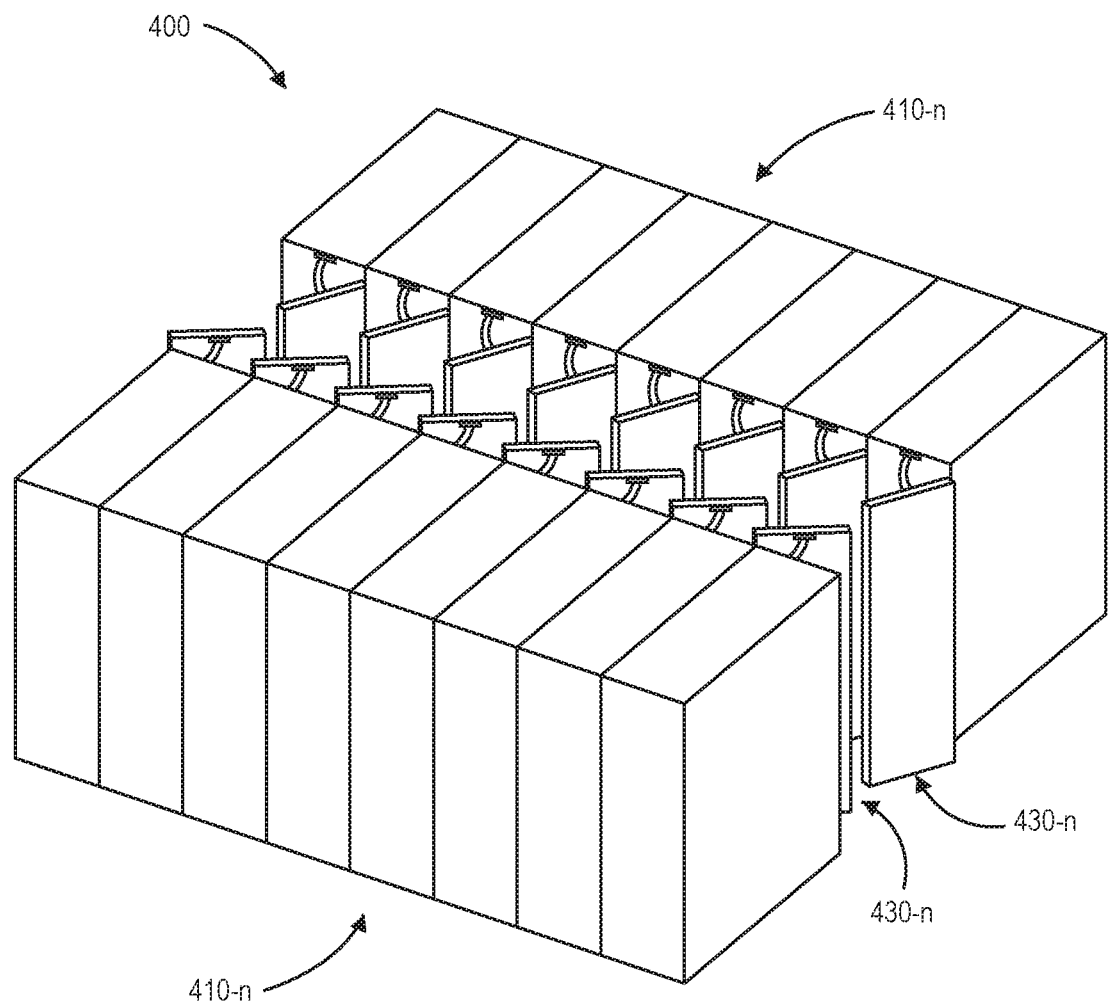

As is shown in FIG. 4A, the system 400 includes a pair of sets of racks 410-$n$ (e.g., data center racks). Each of the racks 410-$n$ in the sets is aligned in series, and the sets of racks 410-$n$ are arranged in parallel with one another, forming a walkway, a passageway or another channel, e.g., a "cool aisle," therebetween. Spaces behind the sets of racks 410-$n$ may also form walkways, passageways or other channels, e.g., "hot aisles." Each of the racks 410-$n$ includes one of the patch panel adapters 430-$n$, and each of the patch panel adapters 430-$n$ may include any number of patch panels mounted thereon.

The movable nature of the adapters 430-$n$ enables the patch panels to provide services to components within the racks 410-$n$, and to be positioned as necessary to enhance cooling flow or to otherwise maintain temperatures within the racks 410-$n$ at desirable levels, while also being repositioned as necessary to permit the installation of components, the removal of components, or maintenance or inspection of the racks 410-$n$ or components, on an as-needed basis. As is shown in FIG. 4B, a user 480 (or a worker, or an associate, or another operator) is tasked with installing a component 420 within a rack 410-1 of the plurality of racks 410-$n$.

Figure 4C:
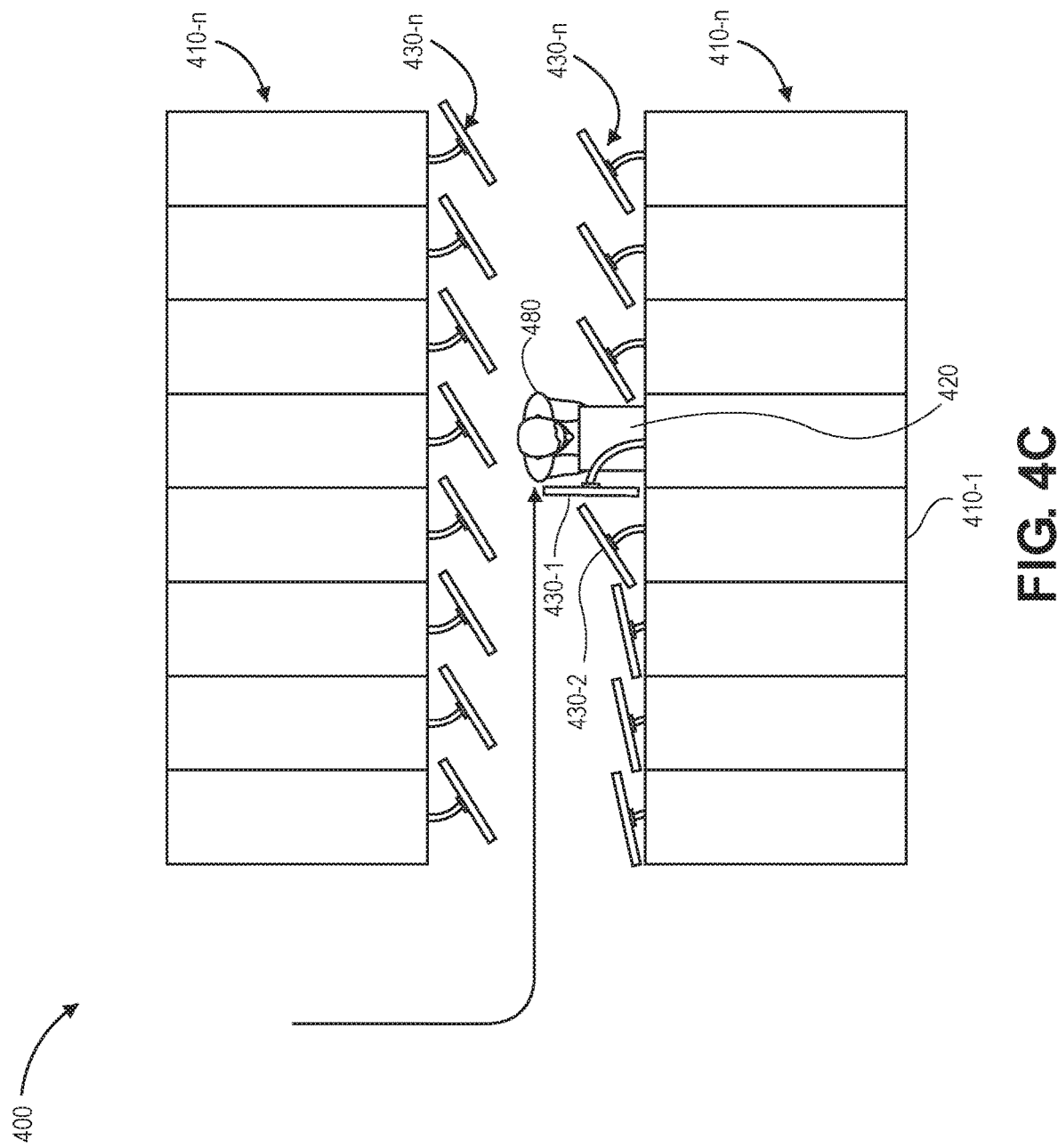

As is shown in FIG. 4C, the user 480 may travel between the sets of the racks 410-$n$, and reposition any of the adapters 430-$n$ as necessary, in order to reach the rack 410-1. For example, as is shown in FIG. 4C, the user 480 may move or close any of the adapters 430-$n$ toward the racks 410-$n$ to which each of the adapters 430-$n$ is mounted, as necessary, in order to access an adapter 430-1 mounted to the rack 410-1. Additionally, upon arriving at the rack 410-1, the user 480 may move or open the adapter 430-1 to expose a front edge of the rack 410-1, and insert the component 420 into the rack 410-1, remove any components from the rack 410-1, or otherwise perform maintenance or inspections of the rack 410-1, on an as-needed basis. For example, the user 480 may move or open the adapter 430-1 to a position that enables the component 420 to be inserted into the rack 410-1, or any components to be removed therefrom, on a temporary basis, even if the adapter 430-1 temporarily obscures, blocks or inhibits access to one or more neighboring ones of the racks 410-$n$. After inserting the component 420 into the rack 410-1, removing any components from the rack 410-1, or otherwise performing maintenance or inspections of the rack 410-1, the user 480 may move or close the adapter 430-1 to a position that does not obscure, block or inhibit access to any of the racks 410-$n$. The user 480 may also move or open any adjacent adapters, e.g., an adapter 430-2, if necessary in order to access the rack 410-1 or the adapter 430-1.

As is shown in FIG. 4D, after installing the component 420 in the rack 410-1, or otherwise completing any maintenance or inspections of the rack 410-1, the adapter 430-1, or any of the other racks 410-1 or adapters 430-1, the user 480 may reposition any of the adapters 430-$n$ as necessary in order to depart from the rack 410-1, such as by restoring one or more of the adapters 430-$n$ to their original positions, or by placing the adapters 430-$n$ in any other positions.

Although the disclosure has been described herein using exemplary techniques, components, and/or processes for implementing the systems and methods of the present disclosure, it should be understood by those skilled in the art that other techniques, components, and/or processes or other combinations and sequences of the techniques, components, and/or processes described herein may be used or performed that achieve the same function(s) and/or result(s) described herein and which are included within the scope of the present disclosure. For example, although some of the implementations of racks or adapters disclosed herein may be described as intended for use with data systems, e.g., as data center racks, those of ordinary skill in the pertinent arts will recognize that the frames or assemblies of the present disclosure are not so limited, and may be utilized in association with any systems or facilities for which power, utility, communications or other services are required, including but not limited to fulfillment centers, materials handling facilities, or other systems or facilities having spaces of limited size that may be provided in any environment or for any purpose.

Moreover, those of ordinary skill in the pertinent arts will further recognize that any type, form or number of the racks or adapters of the present disclosure may be provided singly or in tandem for the purpose of providing power, utility, communications or other services to any number of components, including but not limited to sensors of any type or form. For example, although some of the implementations disclosed herein include racks or adapters having a single frame, those of ordinary skill in the pertinent arts will recognize that two or more racks or adapters may be provided in association with one another, or that each of such racks or adapters may include any number of the components described herein in accordance with the present disclosure.

As is discussed above, used herein, a "materials handling facility" may include, but is not limited to, warehouses, distribution centers, cross-docking facilities, order fulfillment facilities, packaging facilities, shipping facilities, rental facilities, libraries, retail stores or establishments, wholesale stores, museums, or other facilities or combinations of facilities for performing one or more functions of material or inventory handling for any purpose. Likewise, the systems and methods of the present disclosure may also be utilized outside of a traditional materials handling facility environment.

It should be understood that, unless otherwise explicitly or implicitly indicated herein, any of the features, characteristics, alternatives or modifications described regarding a particular implementation herein may also be applied, used, or incorporated with any other implementation described herein, and that the drawings and detailed description of the present disclosure are intended to cover all modifications, equivalents and alternatives to the various implementations as defined by the appended claims. Moreover, with respect to the one or more methods or processes of the present disclosure described herein, orders in which such methods or processes are presented are not intended to be construed as any limitation on the claimed inventions, and any number of the method or process steps or boxes described herein can be combined in any order and/or in parallel to implement the methods or processes described herein. Also, the drawings herein are not drawn to scale.

Conditional language, such as, among others, "can," "could," "might," or "may," unless specifically stated otherwise, or otherwise understood within the context as used, is generally intended to convey in a permissive manner that certain implementations could include, or have the potential to include, but do not mandate or require, certain features, elements and/or steps. In a similar manner, terms such as "include," "including" and "includes are generally intended to mean "including, but not limited to." Thus, such conditional language is not generally intended to imply that features, elements and/or steps are in any way required for one or more implementations or that one or more implementations necessarily include logic for deciding, with or without user input or prompting, whether these features, elements and/or steps are included or are to be performed in any particular implementation.

Disjunctive language such as the phrase "at least one of X, Y, or Z," or "at least one of X, Y and Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain implementations require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:

1. A first rack comprising:
   a cavity defined by a plurality of panels;
   a component installed within an interior of the cavity;
   a patch panel adapter movably mounted to the first rack;
     wherein the patch panel adapter is configured to move between at least a first position and a second position,
     wherein the patch panel adapter comprises a substantially planar element and a patch panel having a first set of ports provided on a first face of the patch panel and a second set of ports provided on a second face of the patch panel,
     wherein the first set of ports is accessible on a first side of the patch panel adapter, and
     wherein the second set of ports is accessible on a second side of the patch panel adapter;
   a first cable comprising a first connector and a second connector,
     wherein the first connector of the first cable is inserted into one of the first set of ports on the first face of the patch panel and the second connector of the first cable is inserted into a port of the component; and
   a second cable comprising a first connector and a second connector,
     wherein the first connector of the second cable is inserted into one of the second set of ports on the second face of the patch panel and the second connector of the second cable is connected to a system in communication with a network, and wherein the one of the first set of ports is in communication with the one of the second set of ports.

2. The first rack of claim 1, wherein a first plane defined by a Front edge of the rack is aligned at an acute angle with respect to a second plane defined by the substantially planar element with the patch panel adapter in the first position, and wherein the first plane is aligned at an obtuse angle with respect to a third plane defined by the substantially planar element with the patch panel adapter in the second position.

3. The first rack of claim 1, wherein the patch panel adapter is mounted to the frame by at least a first hinge and a second hinge, wherein a first end of the first hinge is mounted to the substantially planar element and a second end of the first hinge is mounted to the first rack, and wherein a first end of the second hinge is mounted to the substantially planar element and a second end of the second hinge is mounted to one of the plurality of panels or a panel blank mounted to the first rack.

4. The first rack of claim 1, wherein the first hinge or the second hinge comprises at least one of:

an articulating hinge;
a European hinge;
a frameless hinge;
a pie corner hinge; or
a friction support.

5. The first rack of claim 1, wherein the first rack is provided between a second rack and a third rack, wherein the patch panel adapter inhibits access to the component releasably inserted into the first opening when the patch panel adapter is in the first position, wherein the patch panel adapter does not inhibit access to the cavity of the second rack or the cavity of the third rack when the patch panel adapter is in the first position, wherein the patch panel adapter inhibits access to a cavity of the second rack or a cavity of the third rack when the patch panel adapter is in the second position, and wherein the patch panel adapter does not inhibit access to the component releasably inserted into the first opening when the patch panel adapter is in the second position.

6. A first rack comprising:
a first opening;
a second opening;
a panel blank mounted within or over the second opening;
a patch panel movably mounted to the first rack,
    wherein the patch panel comprises a first port provided on a first face and a second port provided on a second face,
    wherein the first port is in communication with the second port,
    wherein the patch panel is configured to move between at least a first position and a second position,
    wherein a first plane comprising the first face is aligned at a first angle with respect to a second plane defined by a front edge of the first rack with the patch panel in the first position, and
    wherein the first plane is aligned at a second angle with respect to the second plane with the patch panel in the second position;
a component disposed within the first opening,
    wherein the component is one of a cooling system, a network switch, a power supply or a server; and
a panel adapter movably mounted to the first rack by at least one hinge,
    wherein the patch panel is mounted to the panel adapter,
    wherein the at least one hinge has a first end mounted to a portion of the panel adapter,
    wherein the at least one hinge has a second end mounted to a portion of the panel blank, and
    wherein a face of the panel adapter is aligned in the first plane.

7. The first rack of claim 6, wherein the at least one hinge comprises at least one of:
an articulating hinge;
a European hinge;
a frameless hinge;
a pie corner hinge; or
a friction support.

8. The first rack of claim 6, wherein the frame comprises:
a top panel;
a first side panel;
a second side panel; and
a bottom panel,
    wherein each of the first side panel and the second side panel has a common height,
    wherein each of the first side panel, the second side panel, the top panel and the bottom panel has a common length,
    wherein each of the top panel and the bottom panel has a common width, and
    wherein the component is disposed within a portion of a cavity defined at least in part by the first side panel, the second side panel, the top panel and the bottom panel.

9. The first rack of claim 8, wherein the patch panel does not inhibit access to the component disposed within the cavity of the first rack when the patch panel is in the first position, and wherein the patch panel does not inhibit access to a cavity of a second rack provided in association with the first rack when the patch panel is in the second position.

10. A first rack comprising:
a patch panel movably mounted to the first rack,
    wherein the patch panel comprises a first port provided on a first face and a second port provided on a second face,
    wherein the first port is in communication with the second port,
    wherein the patch panel is configured to move between at least a first position and a second position,
    wherein a first plane comprising the first face is aligned at a first angle with respect to a second plane defined by a front edge of the first rack with the patch panel in the first position, and
    wherein the first plane is aligned at a second angle with respect to the second plane with the patch panel in the second position;
a component disposed within the first rack,
    wherein the component is one of a cooling system, a network switch, a power supply or a server;
a first cable having a first connector and a second connector,
    wherein the first connector is inserted into the first port of the patch panel, and
    wherein the second connector is inserted into a port of the component; and
a second cable having a third connector and a fourth connector, wherein the third connector is inserted into the second port of the patch panel, and wherein the fourth connector is connected to one of a network or a power supply.

11. The first rack of claim 10, wherein at least one of the first cable or the second cable is one of a Category 3 cable, a Category 5 cable, a Category 5e cable, a Category 6 cable, a Category 6a cable, a Category 7 cable, a telephone cable, a fiber optic cable, a speaker wire (of any gauge or length), an RCA cable, an F-pin cable, an S-video cable, a Y/C-cable, a coaxial cable, a Digital Visual Interface cable, a High Definition Multimedia Interface cable, a low-voltage cable, or a high-voltage cable.

12. The first rack of claim 10, wherein the frame comprises:
a top panel;
a first side panel;
a second side panel; and
a bottom panel,
wherein each of the first side panel and the second side panel has a common height,
wherein each of the first side panel, the second side panel, the top panel and the bottom panel has a common length,
wherein each of the top panel and the bottom panel has a common width, and
wherein the component is disposed within a portion of a cavity defined at least in part by the first side panel, the second side panel, the top panel and the bottom panel.

13. The first rack of claim 12, wherein the patch panel does not inhibit access to the component disposed within the cavity of the first rack when the patch panel is in the first position, and
wherein the patch panel does not inhibit access to a cavity of a second rack provided in association with the first rack when the patch panel is in the second position.

14. The first rack of claim 10, further comprising:
a panel adapter movably mounted to the first rack, wherein the patch panel is mounted to the panel adapter, and
wherein a face of the panel adapter is aligned in the first plane.

15. The first rack of claim 14, wherein the panel adapter is movably mounted to the first rack by at least one hinge.

16. The first rack of claim 15, wherein the at least one hinge comprises at least one of:
an articulating hinge;
a European hinge;
a frameless hinge;
a pie corner hinge; or
a friction support.

17. A first rack comprising:
a panel adapter having a substantially planar element and a patch panel mounted thereto;
a hinge having a first end and a second end, wherein the panel adapter is configured to move by the hinge between at least a first position and a second position;
a component, wherein the component is one of a modem, a network switch, a router, a server or a transformer;
a panel blank;
a top panel;
a first side panel;
a second side panel; and
a bottom panel,
wherein each of the first side panel and the second side panel has a common height,
wherein each of the first side panel, the second side panel, the top panel and the bottom panel has a common length,
wherein each of the top panel and the bottom panel has a common width,
wherein a cavity defined at least in part by the first side panel, the second side panel, the top panel and the bottom panel comprises a first opening and a second opening,
wherein the component is releasably inserted into the first opening,
wherein the panel blank is inserted into or covers the second opening,
wherein the first end is joined to the panel adapter, and
wherein the second end is joined to the panel blank.

18. The first rack of claim 17, further comprising:
a first cable having a first connector connected to a network and a second connector inserted into one of a first set of ports on a first face of the patch panel; and
a second cable having a third connector connected to one of a second set of ports on a second face of the patch panel and a fourth connector connected to the component,
wherein the one of the first set of ports is in communication with the one of the second set of ports.

19. The first rack of claim 17, wherein the first end is joined to an edge of the panel adapter, and
wherein the panel adapter is configured to pivot about an axis defined by the first end.

20. The first rack of claim 17, wherein the first rack is provided between a second rack and a third rack,
wherein the panel adapter inhibits access to the component releasably inserted into the first opening when the panel adapter is in the first position,
wherein the panel adapter does not inhibit access to the cavity of the second rack or the cavity of the third rack when the panel adapter is in the first position,
wherein the panel adapter inhibits access to a cavity of the second rack or a cavity of the third rack when the panel adapter is in the second position, and
wherein the panel adapter does not inhibit access to the component releasably inserted into the first opening when the panel adapter is in the second position.

* * * * *